US012598832B2

(12) United States Patent
Mori et al.

(10) Patent No.:  US 12,598,832 B2
(45) Date of Patent:  Apr. 7, 2026

(54) DETECTION DEVICE

(71) Applicant: Magnolia White Corporation, Tokyo (JP)

(72) Inventors: Ryuji Mori, Tokyo (JP); Isao Suzumura, Tokyo (JP); Masahiro Tada, Tokyo (JP); Takashi Doi, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 543 days.

(21) Appl. No.: 17/992,054

(22) Filed: Nov. 22, 2022

(65) Prior Publication Data

US 2023/0083488 A1     Mar. 16, 2023

Related U.S. Application Data

(63) Continuation of application No. PCT/JP2021/015508, filed on Apr. 14, 2021.

(30) Foreign Application Priority Data

May 26, 2020    (JP) ................................. 2020-091782

(51) Int. Cl.
*H10F 39/00*          (2025.01)
*H04N 25/10*         (2023.01)
            (Continued)
(52) U.S. Cl.
CPC ........... *H10F 39/809* (2025.01); *H04N 25/10* (2023.01); *H04N 25/70* (2023.01); *H10D 86/481* (2025.01); *H10D 86/60* (2025.01)
(58) Field of Classification Search
CPC ...... H10F 39/809; H04N 25/70; H04N 25/10; H10D 86/60; H10D 86/481
See application file for complete search history.

(56) References Cited

U.S. PATENT DOCUMENTS 6,713,748 B1 *   3/2004  Tsutsumi ........... H10D 30/6733
                                                      257/E29.279
11,322,547 B2    5/2022  Uchino et al.
                        (Continued)

FOREIGN PATENT DOCUMENTS

JP          2010-277378 A     12/2010
JP          2015-195378 A     11/2015
                    (Continued)

OTHER PUBLICATIONS

Office Action issued in related Japanese Patent Application No. 2020-091782, mailed on Jun. 18, 2024 and English translation of same. 7 pages.

(Continued)

*Primary Examiner* — Abdulmajeed Aziz
*Assistant Examiner* — Nathaniel J Lee
(74) *Attorney, Agent, or Firm* — K&L Gates LLP

(57)          ABSTRACT

A detection device includes a substrate, a plurality of photodiodes arranged on the substrate, a plurality of transistors provided correspondingly to each of the photodiodes, an insulating film that covers the transistors, and a plurality of lower electrodes each of which is provided above the insulating film correspondingly to each of the photodiodes, and is electrically coupled to the transistors. The lower electrodes and the photodiodes are stacked in this order above the insulating film, and one of the lower electrodes and one of the photodiodes are provided so as to overlap the transistors in a plan view from a direction orthogonal to the substrate.

10 Claims, 17 Drawing Sheets

(51) Int. Cl.

| | |
|---|---|
| *H04N 25/70* | (2023.01) |
| *H10D 86/40* | (2025.01) |
| *H10D 86/60* | (2025.01) |

(56) References Cited

U.S. PATENT DOCUMENTS

| | | | |
|---|---|---|---|
| 2010/0302134 A1 | 12/2010 | Hasegawa | |
| 2013/0075593 A1* | 3/2013 | Williams, Jr. | H10F 39/8037 257/461 |
| 2015/0109503 A1* | 4/2015 | Mori | H10F 39/199 348/300 |
| 2015/0279884 A1* | 10/2015 | Kusumoto | H10F 39/199 257/43 |
| 2017/0243912 A1 | 8/2017 | Kaneda | |
| 2020/0365660 A1* | 11/2020 | Uchino | H10F 39/811 |
| 2021/0057168 A1 | 2/2021 | Shiomi et al. | |
| 2022/0165800 A1 | 5/2022 | Uchino et al. | |

FOREIGN PATENT DOCUMENTS

| | | | | |
|---|---|---|---|---|
| JP | 2016-201518 A | 12/2016 | | |
| WO | WO2016/072281 A1 | 5/2016 | | |
| WO | WO-2019098315 A1 * | 5/2019 | ............ | H10K 30/30 |
| WO | WO2019/150989 A1 | 8/2019 | | |

OTHER PUBLICATIONS

International Search Report issued in International Patent Application No. PCT/JP2021/015508 on Jun. 22, 2021 and English translation of same. 5 pages.

Written Opinion issued in International Patent Application No. PCT/JP2021/015508 on Jun. 22, 2021. 4 pages.

Office Action issued in related Japanese Patent Application No. 2020-091782, mailed on Sep. 10, 2024 and English translation of same. 9 pages.

\* cited by examiner

Figure 3:
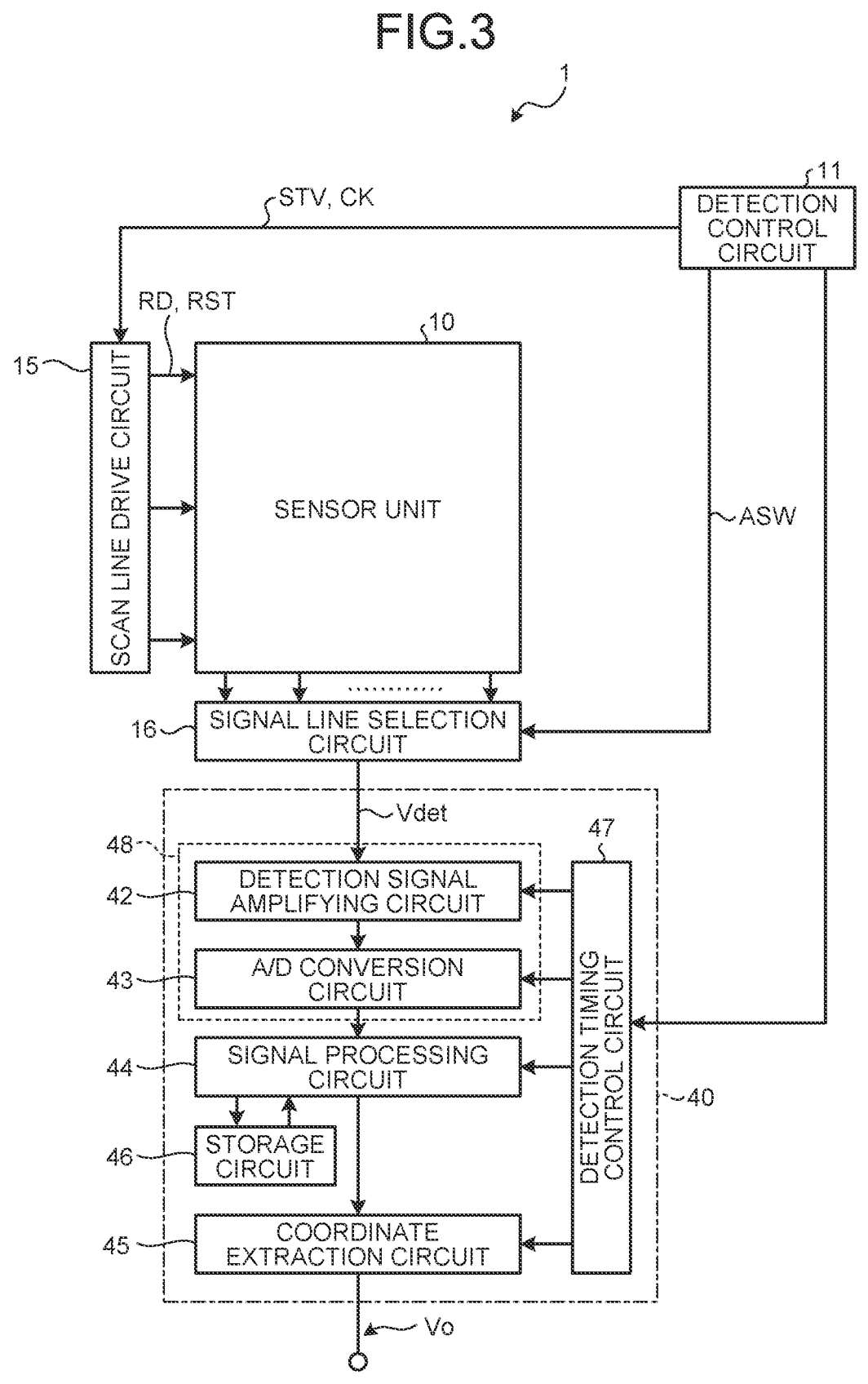

STV, CK

11

DETECTION
CONTROL
CIRCUIT

RD, RST

15

SCAN LINE DRIVE CIRCUIT

10

SENSOR UNIT

ASW

16 — SIGNAL LINE SELECTION
CIRCUIT

Vdet

48

42 — DETECTION SIGNAL
AMPLIFYING CIRCUIT

47

43 — A/D CONVERSION
CIRCUIT

44 — SIGNAL PROCESSING
CIRCUIT

DETECTION TIMING CONTROL CIRCUIT

46 — STORAGE
CIRCUIT

40

45 — COORDINATE
EXTRACTION CIRCUIT

Vo

3

DETECTION DEVICE

CROSS-REFERENCE TO RELATED APPLICATION

This application is a continuation of International Patent Application No. PCT/JP2021/015508 filed on Apr. 14, 2021 which designates the United States, incorporated herein by reference, and which claims the benefit of priority from Japanese Patent Application No. 2020-091782 filed on May 26, 2020, incorporated herein by reference.

BACKGROUND

1. Technical Field

The present disclosure relates to a detection device.

2. Description of the Related Art

A liquid crystal display device of Japanese Patent Application Laid-open Publication No. 2010-277378 includes a plurality of optical sensors. The optical sensors each include a photodiode. The photodiode converts light emitted thereto into a signal (electric charge). The optical sensors are generally arranged in a matrix having a row-column configuration. The optical sensors arranged in a matrix are used in detection devices, for example, as biometric sensors, such as fingerprint sensors and vein sensors, that detect biological information.

Each of the photodiodes is provided with a circuit including a plurality of transistors and capacitive elements. In the case of a configuration provided with the photodiodes in the same plane as that of the transistors, the effective light-receiving area of the photodiode cannot be ensured in some cases.

It is an object of the present disclosure to provide a detection device capable of achieving an improvement in optical sensitivity.

SUMMARY

A detection device according to an embodiment of the present disclosure includes a substrate, a plurality of photodiodes arranged on the substrate, a plurality of transistors provided correspondingly to each of the photodiodes, an insulating film that covers the transistors, and a plurality of lower electrodes each of which is provided above the insulating film correspondingly to each of the photodiodes, and is electrically coupled to the transistors. The lower electrodes and the photodiodes are stacked in this order above the insulating film, and one of the lower electrodes and one of the photodiodes are provided so as to overlap the transistors in a plan view from a direction orthogonal to the substrate.

BRIEF DESCRIPTION OF THE DRAWINGS

FIG. 3 is a block diagram illustrating a configuration example of the detection device according to the first embodiment;

DETAILED DESCRIPTION

Figure 1A:
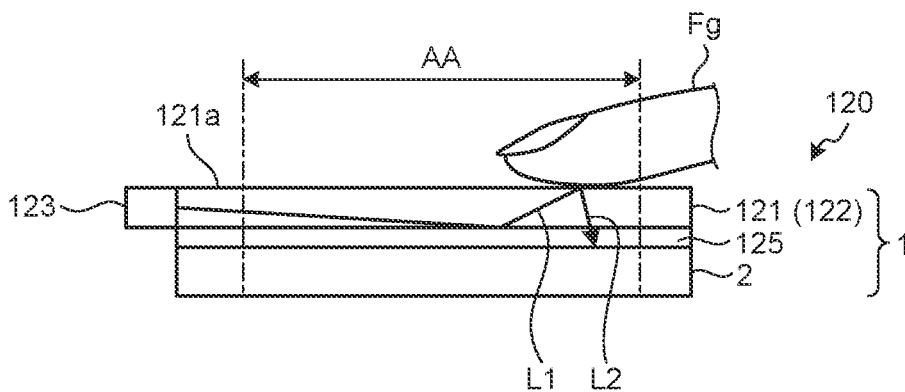
FIG. 1A is a sectional view illustrating a schematic sectional configuration of a detection apparatus having an illumination device, the detection apparatus including a detection device according to a first embodiment of the present disclosure.

The following describes modes (embodiments) for carrying out the present disclosure in detail with reference to the drawings. The present disclosure is not limited to the description of the embodiments given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the disclosure. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference numeral through the description and the drawings, and detailed description thereof may not be repeated where appropriate.

In the present specification and claims, in expressing an aspect of disposing another structure above a certain structure, a case of simply expressing "above" includes both a case of disposing the other structure immediately above the certain structure so as to contact the certain structure and a case of disposing the other structure above the certain structure with still another structure interposed therebetween, unless otherwise specified.

First Embodiment

Figure 1B:
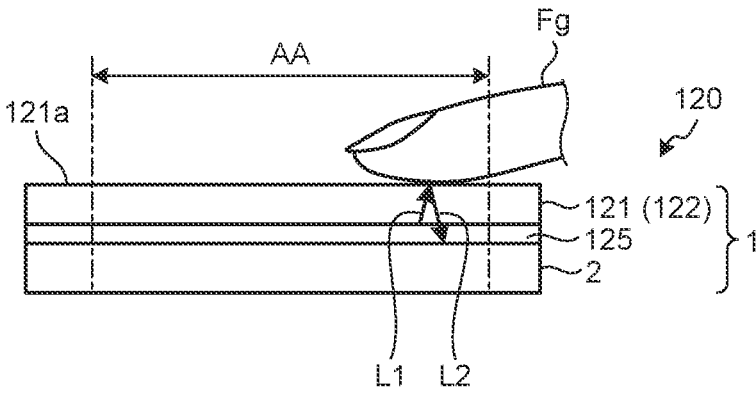
FIG. 1B is a sectional view illustrating a schematic sectional configuration of the detection apparatus having an illumination device, the detection apparatus including the detection device according to a first modification.
Figure 1C:
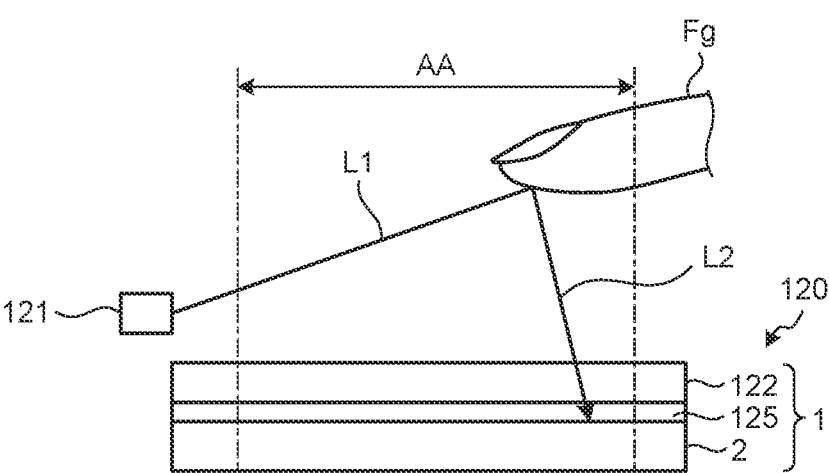
FIG. 1C is a sectional view illustrating a schematic sectional configuration of the detection apparatus having an illumination device, the detection apparatus including the detection device according to a second modification.
Figure 1D:
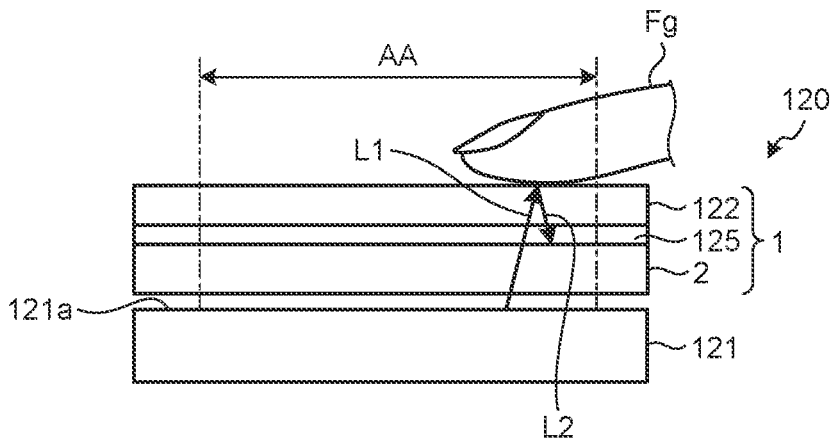
FIG. 1D is a sectional view illustrating a schematic sectional configuration of the detection apparatus having an illumination device, the detection apparatus including the detection device according to a third modification.

FIG. 1A is a sectional view illustrating a schematic sectional configuration of a detection apparatus having an illumination device, the detection apparatus including a detection device according to a first embodiment of the present disclosure. FIG. 1B is a sectional view illustrating a schematic sectional configuration of the detection apparatus having an illumination device, the detection apparatus including the detection device according to a first modification. FIG. 1C is a sectional view illustrating a schematic sectional configuration of the detection apparatus having an illumination device, the detection apparatus including the detection device according to a second modification. FIG. 1D is a sectional view illustrating a schematic sectional configuration of the detection apparatus having an illumination device, the detection apparatus including the detection device according to a third modification.

As illustrated in FIG. 1A, a detection apparatus 120 having an illumination device includes a detection device 1 and an illumination device 121. The detection device 1 includes an array substrate 2, an adhesive layer 125, and a cover member 122. That is, the array substrate 2, the adhesive layer 125, and the cover member 122 are stacked in this order in a direction orthogonal to a surface of the array substrate 2. As will be describe later, the cover member 122 of the detection device 1 may be replaced with the illumination device 121.

As illustrated in FIG. 1A, the illumination device 121 may be, for example, what is called a side light-type front light that uses the cover member 122 as a light guide plate provided in a position corresponding to a detection region AA of the detection device 1 and includes a plurality of light sources 123 arranged at one end or both ends of the cover member 122. That is, the cover member 122 has a light-emitting surface 121a for emitting light, and serves as one component of the illumination device 121. The illumination device 121 emits light L1 from the light-emitting surface 121a of the cover member 122 toward a finger Fg that serves as a detection target. For example, light-emitting diodes (LEDs) for emitting light in a predetermined color are used as the light sources.

As illustrated in FIG. 1B, the illumination device 121 may include the light sources (for example, LEDs) provided directly below the detection region AA of the detection device 1. The illumination device 121 provided with the light source also serves as the cover member 122.

The illumination device 121 is not limited to the example of FIG. 1B. As illustrated in FIG. 1C, the illumination device 121 may be provided on a lateral side or an upper side of the cover member 122, and may emit the light L1 to the finger Fg from the lateral side or the upper side of the finger Fg.

Furthermore, as illustrated in FIG. 1D, the illumination device 121 may be what is called a direct-type backlight that includes the light sources (for example, LEDs) provided in the detection region of the detection device 1.

The light L1 emitted from the illumination device 121 is reflected as light L2 by the finger Fg serving as the detection target. The detection device 1 detects the light L2 reflected by the finger Fg to detect asperities (such as a fingerprint) on a surface of the finger Fg. The detection device 1 may further detect information on a living body by detecting the light L2 reflected in the finger Fg, in addition to detecting the fingerprint. Examples of the information on the living body include a blood vessel image, pulsation, and a pulse wave of, for example, a vein. The color of the light L1 from the illumination device 121 may be varied according to the detection target.

The cover member 122 is a member for protecting the array substrate 2, and covers the array substrate 2. The illumination device 121 may have a structure to serve also as the cover member 122, as described above. In the structures illustrated in FIGS. 1C and 1D in which the cover member 122 is separate from the illumination device 121, the cover member 122 is, for example, a glass substrate. The cover member 122 is not limited to the glass substrate, and may be a resin substrate, for example. The cover member 122 need not be provided. In this case, the surface of the array substrate 2 is provided with a protective layer of, for example, an insulating film, and the finger Fg contacts the protective layer of the detection device 1.

The detection apparatus 120 having an illumination device may be provided with a display panel instead of the illumination device 121, as illustrated in FIG. 1B. The display panel may be, for example, an organic electroluminescent (EL) (organic light-emitting diode (OLED)) display panel or an inorganic EL (micro-LED or mini-LED) display panel. Alternatively, the display panel may be a liquid crystal display (LCD) panel using liquid crystal elements as display elements or an electrophoretic display (EPD) panel using electrophoretic elements as the display elements. Also in this case, the fingerprint of the finger Fg and the information on the living body can be detected based on the light L2 obtained by reflection by the finger Fg of display light (light L1) emitted from the display panel.

Figure 2:
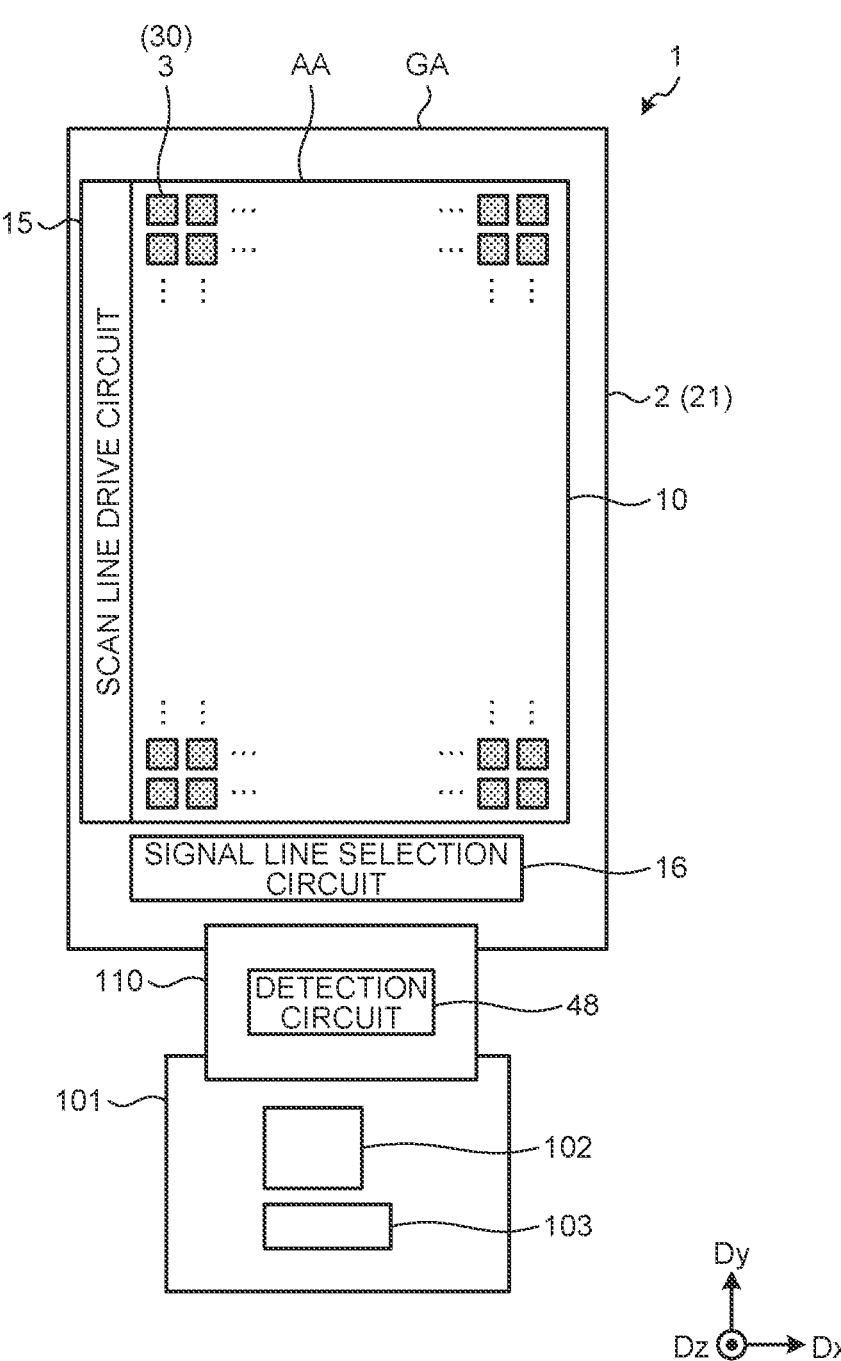
FIG. 2 is a plan view illustrating the detection device according to the first embodiment.

FIG. 2 is a plan view illustrating the detection device according to the first embodiment. A first direction Dx illustrated in FIG. 2 and the subsequent drawings is one direction in a plane parallel to a substrate 21. A second direction Dy is one direction in the plane parallel to the substrate 21, and is a direction orthogonal to the first direction Dx. The second direction Dy may non-orthogonally intersect the first direction Dx. A third direction Dz is a direction orthogonal to the first direction Dx and the second direction Dy, and is a direction normal to the substrate 21.

As illustrated in FIG. 2, the detection device 1 includes the array substrate 2 (substrate 21), a sensor unit 10, a scan line drive circuit 15, a signal line selection circuit 16, a detection circuit 48, a control circuit 102, and a power supply circuit 103.

The substrate 21 is electrically coupled to a control substrate 101 through a wiring substrate 110. The wiring substrate 110 is, for example, a flexible printed circuit board or a rigid circuit board. The wiring substrate 110 is provided with the detection circuit 48. The control substrate 101 is provided with the control circuit 102 and the power supply circuit 103. The control circuit 102 is, for example, a field-programmable gate array (FPGA). The control circuit 102 supplies control signals to the sensor unit 10, the scan line drive circuit 15, and the signal line selection circuit 16 to control an operation of the sensor unit 10. The power supply circuit 103 supplies voltage signals including, for example, a power supply potential VDD and a reference potential VCOM (refer to FIG. 4) to the sensor unit 10, the scan line drive circuit 15, and the signal line selection circuit 16. In the present embodiment, the case is exemplified where the detection circuit 48 is disposed on the wiring substrate 110, but the present disclosure is not limited to this case. The detection circuit 48 may be disposed on the substrate 21.

The substrate 21 has the detection region AA and a peripheral region GA. The detection region AA and the peripheral region GA extend in planar directions parallel to the substrate 21. Elements (detection elements 3) of the sensor unit 10 are provided in the detection region AA. The peripheral region GA is a region outside the detection region AA, and is a region not provided with the elements (detection elements 3). That is, the peripheral region GA is a region between the outer perimeter of the detection region AA and outer edges of the substrate 21. The scan line drive circuit 15 and the signal line selection circuit 16 are provided in the peripheral region GA. The scan line drive circuit 15 is provided in a region extending along the second direction Dy in the peripheral region GA. The signal line selection circuit 16 is provided in a region extending along the first direction Dx in the peripheral region GA, and is provided between the sensor unit 10 and the detection circuit 48.

Each of the detection elements 3 of the sensor unit 10 is an optical sensor including a photodiode 30 as a sensor element. The photodiode 30 is a photoelectric conversion element, and outputs an electrical signal corresponding to light irradiating each of the photodiodes 30. More specifically, the photodiode 30 is a positive-intrinsic-negative (PIN) photodiode. The photodiode 30 may be paraphrased as an organic photodiode (OPD). The detection elements 3 are arranged in a matrix having a row-column configuration in the detection region AA. The photodiode 30 included in each of the detection elements 3 performs the detection according to gate drive signals (for example, a reset control signal RST and a read control signal RD) supplied from the scan line drive circuit 15. Each of the photodiodes 30 outputs the electrical signal corresponding to the light irradiating the photodiode 30 as a detection signal Vdet to the signal line selection circuit 16. The detection device 1 detects the information on the living body based on the detection signals Vdet received from the photodiodes 30.

FIG. 3 is a block diagram illustrating a configuration example of the detection device according to the first embodiment. As illustrated in FIG. 3, the detection device 1 further includes a detection control circuit 11 and a detector 40. One, some, or all functions of the detection control circuit 11 are included in the control circuit 102. One, some, or all functions of the detector 40 other than those of the detection circuit 48 are also included in the control circuit 102.

The detection control circuit 11 is a circuit that supplies respective control signals to the scan line drive circuit 15, the signal line selection circuit 16, and the detector 40 to control operations of these components. The detection control circuit 11 supplies various control signals including, for example, a start signal STV and a clock signal CK to the scan line drive circuit 15. The detection control circuit 11 also supplies various control signals including, for example, a selection signal ASW to the signal line selection circuit 16.

The scan line drive circuit 15 is a circuit that drives a plurality of scan lines (read control scan lines GLrd and reset control scan lines GLrst (refer to FIG. 4)) based on the various control signals. The scan line drive circuit 15 sequentially or simultaneously selects the scan lines, and supplies the gate drive signals (for example, the reset control signals RST and the read control signals RD) to the selected scan lines. Through this operation, the scan line drive circuit 15 selects the photodiodes 30 coupled to the scan lines.

Figure 4:
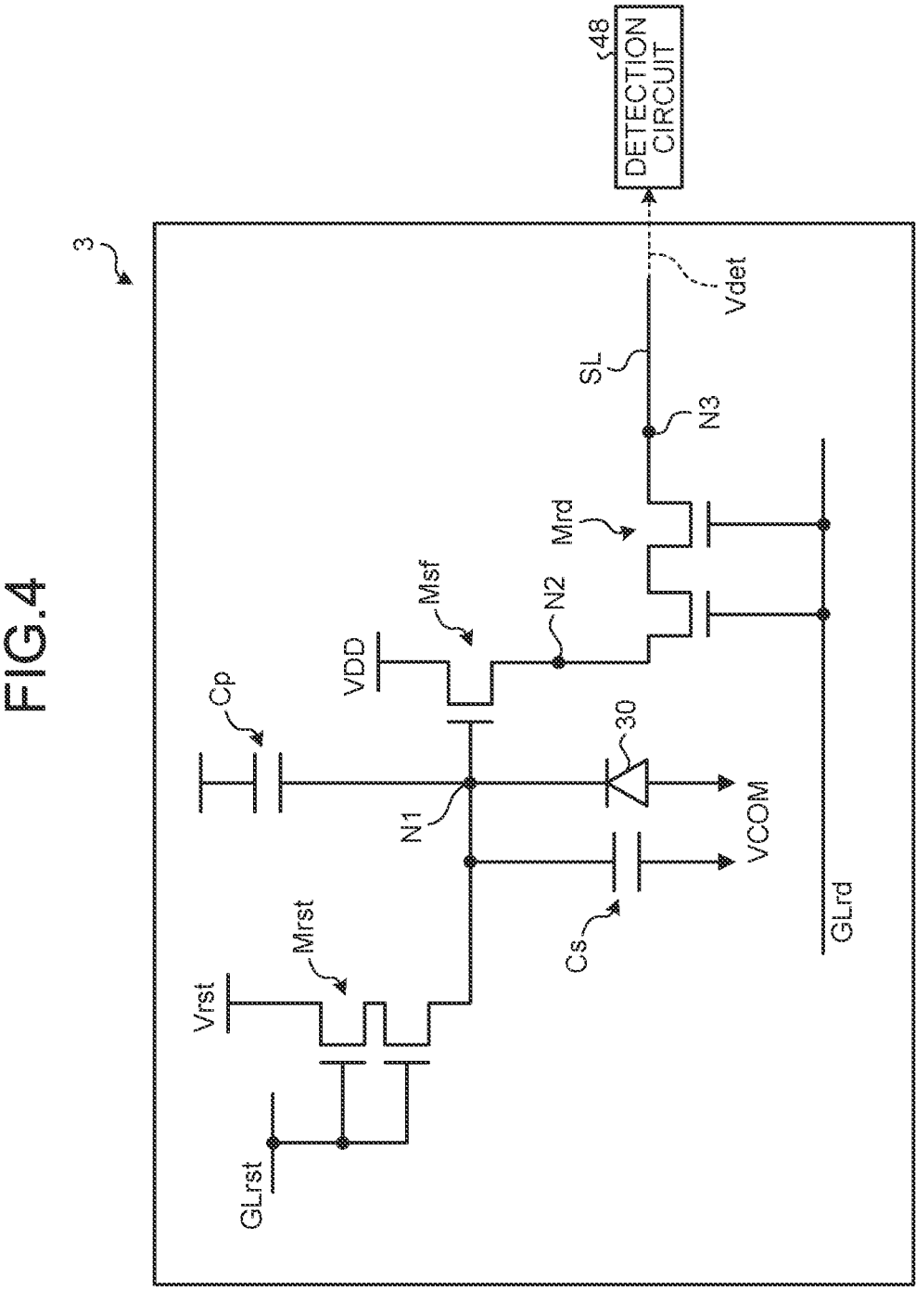
FIG. 4 is a circuit diagram illustrating a detection element.

The signal line selection circuit 16 is a switch circuit that sequentially or simultaneously selects a plurality of output signal lines SL (refer to FIG. 4). The signal line selection circuit 16 is, for example, a multiplexer. The signal line selection circuit 16 couples the selected output signal lines SL to the detection circuit 48 based on the selection signal ASW supplied from the detection control circuit 11. Through this operation, the signal line selection circuit 16 outputs the detection signals Vdet of the photodiodes 30 to the detector 40.

The detector 40 includes the detection circuit 48, a signal processing circuit 44, a coordinate extraction circuit 45, a storage circuit 46, and a detection timing control circuit 47. The detection timing control circuit 47 performs control to cause the detection circuit 48, the signal processing circuit 44, and the coordinate extraction circuit 45 to operate in synchronization with one another based on a control signal supplied from the detection control circuit 11.

The detection circuit 48 is, for example, an analog front-end (AFE) circuit. The detection circuit 48 is a signal processing circuit having functions of at least a detection signal amplifying circuit 42 and an analog-to-digital (A/D) conversion circuit 43. The detection signal amplifying circuit 42 amplifies the detection signal Vdet, and is an integration circuit, for example. The A/D conversion circuit 43 converts an analog signal output from the detection signal amplifying circuit 42 into a digital signal.

The signal processing circuit 44 is a logic circuit that detects a predetermined physical quantity received by the sensor unit 10 based on output signals of the detection circuit 48. The signal processing circuit 44 can detect asperities on the surface of the finger Fg or a palm based on the signals from the detection circuit 48 when the finger Fg is in contact with or in proximity to a detection surface. The signal processing circuit 44 may detect the information on the living body based on the signals from the detection circuit 48. Examples of the information on the living body include a blood vessel image, a pulse wave, pulsation, and a blood oxygen saturation level of the finger Fg or the palm.

The storage circuit 46 temporarily stores therein signals calculated by the signal processing circuit 44. The storage circuit 46 may be, for example, a random-access memory (RAM) or a register circuit.

The coordinate extraction circuit 45 is a logic circuit that obtains detected coordinates of the asperities on the surface of the finger Fg or the like when the contact or proximity of the finger Fg or the like is detected by the signal processing circuit 44. The coordinate extraction circuit 45 is the logic circuit that also obtains detected coordinates of blood vessels of the finger Fg or the palm. The coordinate extraction circuit 45 combines the detection signals Vdet output from the respective detection elements 3 of the sensor unit 10 to generate two-dimensional information representing a shape of the asperities on the surface of the finger Fg or the like. The coordinate extraction circuit 45 may output the detection signals Vdet as sensor outputs Vo instead of calculating the detected coordinates.

The following describes a circuit configuration example of the detection device 1. FIG. 4 is a circuit diagram illustrating a detection element. As illustrated in FIG. 4, the detection element 3 includes the photodiode 30, a reset transistor Mrst, a read transistor Mrd, and a source follower transistor Msf. The reset transistor Mrst, the read transistor Mrd, and the source follower transistor Msf are provided correspondingly to each of the photodiodes 30. The reset transistor Mrst, the read transistor Mrd, and the source follower transistor Msf are each constituted by an n-type thin-film transistor (TFT). However, each of the transistors is not limited thereto, and may be constituted by a p-type TFT.

The reference potential VCOM is applied to the anode of the photodiode 30. The cathode of the photodiode 30 is coupled to a node N1. The node N1 is coupled to a capacitive element Cs, one of the source and the drain of the reset transistor Mrst, and the gate of the source follower transistor Msf. The node N1 further has parasitic capacitance Cp. When light is incident on the photodiode 30, a signal (electric charge) output from the photodiode 30 is stored in the capacitive element Cs. The capacitive element Cs is a capacitor formed between an upper electrode 34 and a lower electrode 35 (refer to FIG. 7) that are coupled to the photodiode 30. The parasitic capacitance Cp is capacitance added to the capacitive element Cs, and is capacitance generated among various types of wiring and electrodes provided on the array substrate 2.

The gates of the reset transistor Mrst are coupled to a corresponding one of the reset control scan lines GLrst. The other of the source and the drain of the reset transistor Mrst is coupled to a reset signal line SLrst, and is supplied with a reset potential Vrst. When the reset transistor Mrst is turned on (into a conduction state) in response to the reset control signal RST, the potential of the node N1 is reset to the reset potential Vrst. The reference potential VCOM is lower than the reset potential Vrst, and the photodiode 30 is driven in a reverse bias state.

The source follower transistor Msf is coupled between a terminal supplied with the power supply potential VDD and the read transistor Mrd (node N2). The gate of the source follower transistor Msf is coupled to the node N1. The gate of the source follower transistor Msf is supplied with a signal (electric charge) generated by the photodiode 30. This operation causes the source follower transistor Msf to output a voltage signal corresponding to the signal (electric charge) generated by the photodiode 30 to the read transistor Mrd.

The read transistor Mrd is coupled between the source of the source follower transistor Msf (node N2) and a corresponding one of the output signal lines SL (node N3). The gates of the read transistor Mrd are coupled to a corresponding one of the read control scan lines GLrd. When the read transistor Mrd is turned on in response to the read control signal RD, the signal output from the source follower transistor Msf, that is, the voltage signal corresponding to the signal (electric charge) generated by the photodiode 30 is output as the detection signal Vdet to the output signal line SL.

In the example illustrated in FIG. 4, the reset transistor Mrst and the read transistor Mrd each have what is called a double-gate structure configured by coupling two transistors in series. However, the reset transistor Mrst and the read transistor Mrd are not limited to this structure, and may have a single-gate structure, or a multi-gate structure including three or more transistors coupled in series. The circuit of each of the detection elements 3 is not limited to the configuration including the three transistors of the reset transistor Mrst, the source follower transistor Msf, and the read transistor Mrd. The detection element 3 may include two transistors, or four or more transistors.

Figure 5:
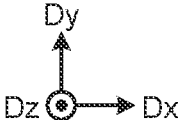
FIG. 5 is a plan view illustrating an array substrate constituting the detection element.
Figure 6:
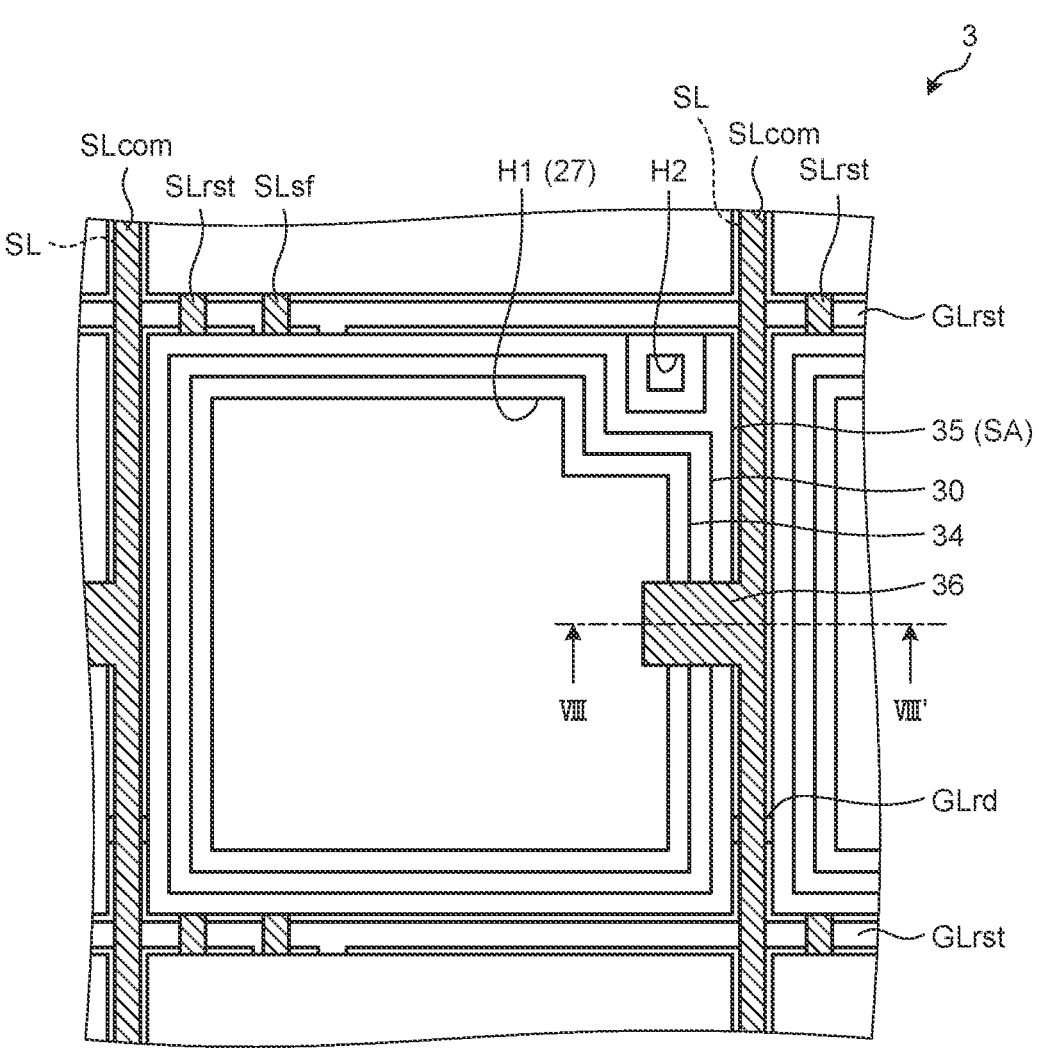
FIG. 6 is a plan view illustrating the detection element.
Figure 6:
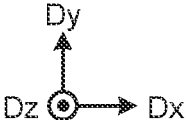

The following describes a planar configuration of the detection element 3. FIG. 5 is a plan view illustrating the array substrate constituting the detection element. FIG. 6 is a plan view illustrating the detection element. FIG. 5 is a plan view schematically illustrating a portion of the detection element 3, that is, a portion thereof except members above the photodiode 30. FIG. 5 illustrates the lower electrode 35 and the photodiode 30 with long dashed double-short dashed lines.

As illustrated in FIG. 5, the reset control scan lines GLrst extend in the first direction Dx, and are separately arranged in the second direction Dy. The output signal lines SL extend in the second direction Dy, and are separately arranged in the first direction Dx. The photodiode 30 of the detection element 3 is provided in a region surrounded by two of the reset control scan lines GLrst adjacent in the second direction Dy and two of the output signal lines SL adjacent in the first direction Dx.

The detection element 3 further includes the read control scan line GLrd and two signal lines (power supply signal line SLsf and reset signal line SLrst). The read control scan line GLrd extends in the first direction Dx, and is arranged side by side with the reset control scan line GLrst in the second direction Dy. Each of the power supply signal line SLsf and the reset signal line SLrst extends in the second direction Dy, and is arranged side by side with the output signal line SL in the first direction Dx.

As illustrated in FIG. 5, the reset transistor Mrst of the detection element 3 includes a first semiconductor layer 61, a source electrode 62, a drain electrode 63, and gate electrodes 64. One end of the first semiconductor layer 61 is coupled to the reset signal line SLrst. The other end of the first semiconductor layer 61 is coupled to coupling wiring SLcn. A portion of the reset signal line SLrst coupled to the first semiconductor layer 61 serves as the source electrode 62, and a portion of the coupling wiring SLcn coupled to the first semiconductor layer 61 serves as the drain electrode 63.

The gate electrodes 64 face the first semiconductor layer 61. More specifically, the reset control scan line GLrst is provided with two branches branching in the second direction Dy, and the first semiconductor layer 61 extends in the first direction Dx and intersects the two branches of the reset control scan line GLrst. Channel regions are formed at portions of the first semiconductor layer 61 overlapping the two branches of the reset control scan line GLrst, and portions of the two branches of the reset control scan line GLrst that overlap the first semiconductor layer 61 serve as the gate electrodes 64. Thus, the reset transistor Mrst is configured as a double-gate structure in which the two gate electrodes 64 are provided so as to overlap the first semiconductor layer 61.

The source follower transistor Msf of the detection element 3 includes a second semiconductor layer 65, a source electrode 67, and a gate electrode 68. One end of the second semiconductor layer 65 is coupled to the power supply signal line SLsf through a coupling portion SLsfa. The other end of the second semiconductor layer 65 is coupled to the read transistor Mrd. A portion of the coupling portion SLsfa coupled to the second semiconductor layer 65 serves as the source electrode 67.

One end of the gate electrode 68 is coupled to the coupling wiring SLcn through a contact hole. The second semiconductor layer 65 intersects the gate electrode 68. A channel region is formed at a portion of the second semiconductor layer 65 intersecting the gate electrode 68. The source follower transistor Msf is configured as a single-gate structure in which the one gate electrode 68 is provided so as to overlap the second semiconductor layer 65. The reset transistor Mrst is electrically coupled to the gate of the source follower transistor Msf through the coupling wiring SLcn.

The coupling wiring SLcn is disposed between the power supply signal line SLsf and the output signal line SL adjacent to each other in the first direction Dx. The coupling wiring SLcn includes a portion that is coupled to the reset transistor Mrst and extends in the first direction Dx, and a portion that is coupled to the source follower transistor Msf and extends in the second direction Dy. The cathode (n-type semiconductor layer 33) of the photodiode 30 of the detection element 3 is coupled to the coupling wiring SLcn through a contact hole H2. The configuration electrically couples the cathode (n-type semiconductor layer 33) of the photodiode 30 to the reset transistor Mrst and the source follower transistor Msf through the coupling wiring SLcn.

The read transistor Mrd includes the second semiconductor layer 65, a drain electrode 72, and gate electrodes 74. The second semiconductor layer 65 of the read transistor Mrd is formed of a semiconductor layer integrated with the second semiconductor layer 65 of the source follower transistor Msf. In other words, the read transistor Mrd and the source follower transistor Msf include the common second semiconductor layer 65. The other end of the second semiconductor layer 65 of the read transistor Mrd is coupled to the output signal line SL through a coupling portion SLa. In other words, a portion of the coupling portion SLa coupled to the second semiconductor layer 65 serves as the drain electrode 72.

The read control scan line GLrd is coupled to a branch that is adjacent thereto in the second direction Dy and extends in the first direction Dx. The second semiconductor layer 65 intersects the read control scan line GLrd and the branch. Portions of the read control scan line GLrd and the branch that overlap the second semiconductor layer 65 serve as the gate electrodes 74. Thus, the read transistor Mrd is configured as a double-gate structure in which the two gate electrodes 74 are provided so as to overlap the second semiconductor layer 65.

In the present embodiment, the second semiconductor layer 65 is arranged adjacent to the output signal line SL in the first direction Dx, and the second semiconductor layer 65 and the output signal line SL extend in the second direction Dy. The two gate electrodes 74 included in the read transistor Mrd and the one gate electrode 68 included in the source follower transistor Msf are arranged in the second direction Dy so as to overlap the second semiconductor layer 65. With this configuration, the source follower transistor Msf having a single-gate structure and the read transistor Mrd having a double-gate structure include the common second semiconductor layer 65.

Such a configuration can arrange the transistors and the wiring more efficiently than when forming each of the read transistor Mrd and the source follower transistor Msf from an individual semiconductor layer. In the present embodiment, the read transistor Mrd has a double-gate structure, so that a leakage current can be restrained from flowing toward the output signal line SL.

A first width W1 of the first semiconductor layer 61 of the reset transistor Mrst is smaller than a second width W2 of the second semiconductor layer 65 of the read transistor Mrd and the source follower transistor Msf. Each of the first width W1 and the second width W2 is a channel width, and is a length in a direction intersecting the extending direction between the source and the drain of each of the semiconductor layers. For example, the first width W1 represents the length of the first semiconductor layer 61 in the second direction Dy, and the second width W2 represents the length of the second semiconductor layer 65 in the first direction Dx. The first width W1 of the first semiconductor layer 61 is smaller than a third width W3 of contact portions with the source electrode 62 and the drain electrode 63. In the present embodiment, since the first width W1 is smaller than the second width W2 and the third width W3, the leakage current of the reset transistor Mrst can be reduced more effectively than the read transistor Mrd side.

As illustrated in FIGS. 5 and 6, the photodiode 30 is provided in the region surrounded by two of the reset control scan lines GLrst adjacent in the second direction Dy and two of the output signal lines SL adjacent in the first direction Dx. The upper electrode 34 and the lower electrode 35 face each other with the photodiode 30 interposed therebetween in the third direction Dz. Specifically, the photodiode 30 is disposed above the array substrate 2 provided with the various types of wiring and the various transistors with the lower electrode 35 interposed therebetween.

The lower electrode 35 has a larger area than the photodiode 30 and the upper electrode 34 in the plan view. The lower electrode 35 is electrically coupled to the reset transistor Mrst and the source follower transistor Msf through the contact hole H2 at a portion overlapping neither the photodiode 30 nor the upper electrode 34. The upper electrode 34 is provided so as to cover the photodiode 30. A contact hole H1 provided in an insulating film 27 is provided so as to overlap most of the region of the upper electrode 34, and the insulating film 27 overlaps the upper electrode 34 only at the periphery of the upper electrode 34. The upper electrode 34 is coupled to reference potential supply wiring SLcom through coupling wiring 36. The reference potential supply wiring SLcom is wiring for supplying the reference potential VCOM to the photodiode 30, and is provided extending in the second direction Dy so as to overlap the output signal line SL. The coupling wiring 36 is located in the same layer as that of the reference potential supply wiring SLcom, and more in detail, corresponds to wiring portion drawn out as the coupling wiring 36 from the reference potential supply wiring SLcom.

As illustrated in FIGS. 5 and 6, the photodiode 30 and the lower electrode 35 are provided so as to overlap the various types of wiring and the various transistors (reset transistor Mrst, read transistor Mrd, and source follower transistor Msf). The photodiode 30 and the lower electrode 35 are provided so as to overlap also some of the signal lines and the scan lines (power supply signal line SLsf, reset signal line SLrst, and read control scan line GLrd). A sensor region SA of the detection element 3 is defined by the lower electrode 35 coupled to the photodiode 30. The optical sensitivity (sensor output) of the detection device 1 can be improved by increasing the area of the sensor region SA.

Figure 7:
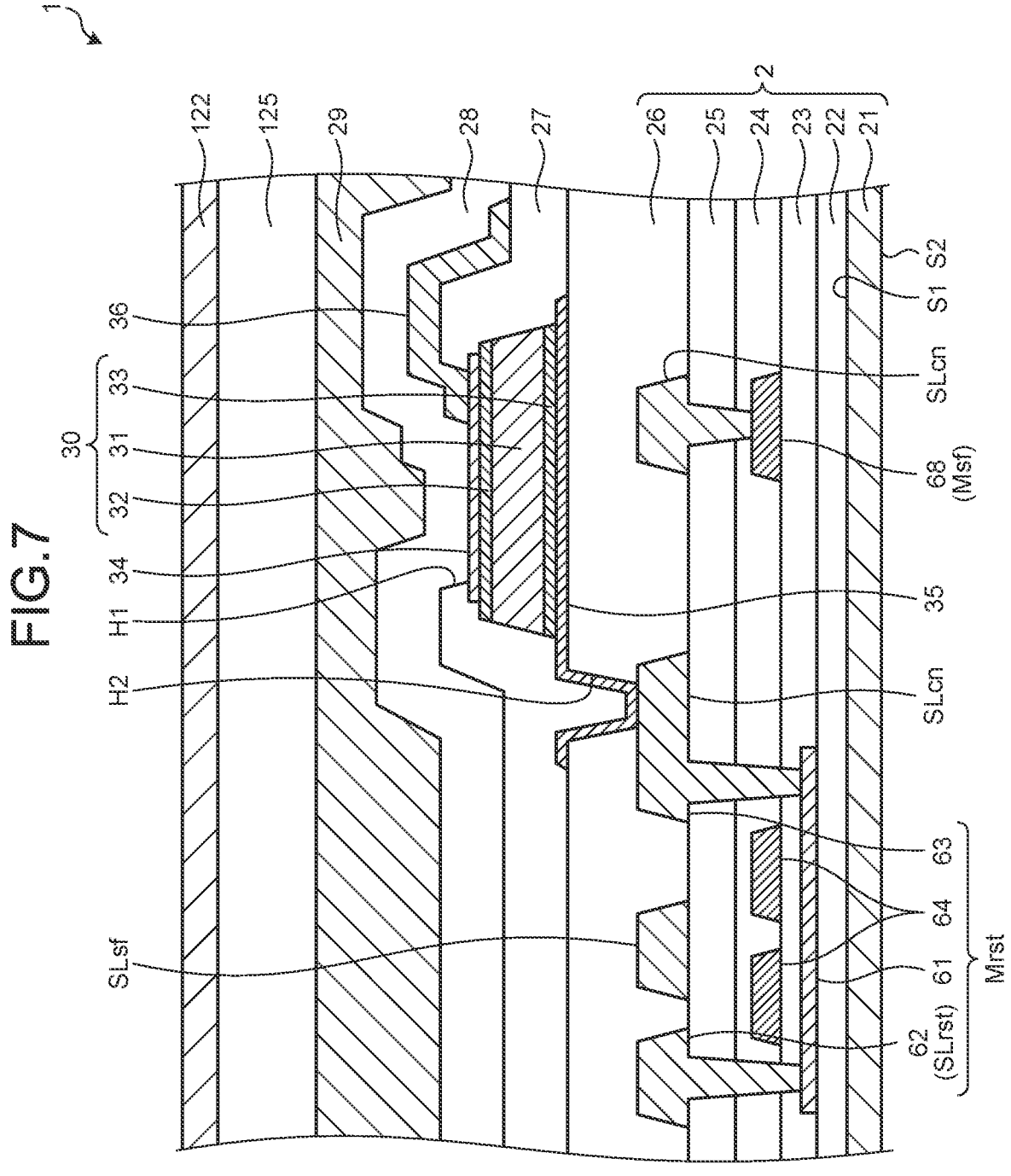
FIG. 7 is a VII-VII' sectional view of FIG. 5.

The following describes a sectional configuration of the detection element 3. FIG. 7 is a VII-VII' sectional view of FIG. 5. While FIG. 7 illustrates a sectional configuration of the reset transistor Mrst among the three transistors included in the detection element 3, each of the source follower transistor Msf and the read transistor Mrd also has a sectional configuration similar to that of the reset transistor Mrst.

As illustrated in FIG. 7, the substrate 21 is an insulating substrate. A glass substrate of, for example, quartz or alkali-free glass is used as the substrate 21. The substrate 21 has a first principal surface S1, and a second principal surface S2 on the opposite side of the first principal surface S1. The various transistors including the reset transistor Mrst, the various types of wiring (scan lines and signal lines), and insulating films are provided on the first principal surface S1 of the substrate 21 to form the array substrate 2. The photodiodes 30 are arranged above the array substrate 2, that is, on the first principal surface S1 side of the substrate 21.

An undercoat film 22 is provided on the first principal surface S1 of the substrate 21. The undercoat film 22, insulating films 23, 24, and 25, and insulating films 27 and 28 are inorganic insulating films, and are formed of, for example, silicon oxide ($SiO_2$) or silicon nitride (SiN).

The first semiconductor layer 61 is provided above the undercoat film 22. For example, polysilicon is used as the first semiconductor layer 61. The first semiconductor layer 61 is, however, not limited thereto, and may be formed of, for example, a microcrystalline oxide semiconductor, an amorphous oxide semiconductor, or low-temperature polycrystalline silicon (LTPS).

The insulating film 23 is provided above the undercoat film 22 so as to cover the first semiconductor layer 61. The gate electrodes 64 are provided above the insulating film 23. The gate electrode 68 of the source follower transistor Msf is provided in the same layer as that of the gate electrodes 64, and is also provided above the insulating film 23. The reset control scan line GLrst and the read control scan line GLrd are also provided in the same layer as that of the gate electrodes 64. The insulating film 24 is provided above the insulating film 23 so as to cover the gate electrodes 64.

As illustrated in FIG. 7, the reset transistor Mrst has a top-gate structure in which the gate electrodes 64 are provided above the first semiconductor layer 61. However, in the detection device 1 of the present disclosure, the reset transistor Mrst may have a bottom-gate structure in which the gate electrodes 64 are provided below the first semiconductor layer 61, or a dual-gate structure in which the gate electrodes 64 are provided above and below the first semiconductor layer 61.

The insulating films 24 and 25 are provided above the insulating film 23 so as to cover the gate electrodes 64. The source electrode 62 and the drain electrode 63 are provided above the insulating film 25. The source electrode 62 and the drain electrode 63 are each coupled to the first semiconductor layer 61 through a contact hole passing through the insulating films 23, 24, and 25. The source electrode 62 and the drain electrode 63 are formed of, for example, a multi-layered film of Ti—Al—Ti layers or Ti—Al layers that has a multilayered structure of titanium and aluminum.

The various signal lines (output signal line SL, power supply signal line SLsf, and reset signal line SLrst) and the coupling wiring SLcn are provided in the same layer as that of the source electrode 62 and drain electrode 63. The coupling wiring SLcn of the detection element 3 is coupled to the gate electrode 68 of the source follower transistor Msf through a contact hole passing through the insulating films 24 and 25.

As illustrated in FIG. 7, an insulating film 26 is provided above the insulating film 25 so as to cover the various transistors, including the reset transistor Mrst, for example. The insulating film 26 is formed of an organic material such as a photosensitive acrylic material. The insulating film 26 is thicker than the insulating film 25. The insulating film 26 has a better step covering property than that of inorganic insulating materials, and can planarize steps formed by the various transistors and the various types of wiring.

The following describes a sectional configuration of the photodiode 30. The photodiode 30 is provided above the insulating film 26. Specifically, the lower electrode 35 is provided above the insulating film 26, and is electrically coupled to the coupling wiring SLcn through the contact hole H2. The photodiode 30 is coupled to the lower electrode 35. The lower electrode 35 can employ, for example, a multilayered structure of titanium (Ti) and titanium nitride (TiN). Since the lower electrode 35 is provided between the substrate 21 and the photodiode 30, the lower electrode 35 serves as a light-blocking layer, and can restrain light from entering the photodiode 30 from the second principal surface S2 side of the substrate 21.

The photodiode 30 includes a semiconductor layer having a photovoltaic effect. Specifically, the semiconductor layer of the photodiode 30 includes an i-type semiconductor layer 31, a p-type semiconductor layer 32, and the n-type semiconductor layer 33. The i-type semiconductor layer 31, the p-type semiconductor layer 32, and the n-type semiconductor layer 33 are formed of, for example, amorphous silicon (a-Si). The material of the semiconductor layers is not limited thereto, and may be, for example, polysilicon or microcrystalline silicon.

The a-Si of the p-type semiconductor layer 32 is doped with impurities to form a p+ region. The a-Si of the n-type semiconductor layer 33 is doped with impurities to form an n+ region. The i-type semiconductor layer 31 is, for example, a non-doped intrinsic semiconductor, and has lower electric conductivity than that of the p-type semiconductor layer 32 and the n-type semiconductor layer 33.

The i-type semiconductor layer 31 is provided between the n-type semiconductor layer 33 and the p-type semiconductor layer 32 in a direction orthogonal to a surface of the substrate 21 (in the third direction Dz). In the present embodiment, the n-type semiconductor layer 33, the i-type semiconductor layer 31, and the p-type semiconductor layer 32 are stacked in this order above the lower electrode 35. In the present embodiment, the upper electrode 34 serves as the anode of the photodiode 30, and the lower electrode 35 serves as the cathode of the photodiode 30.

The n-type semiconductor layer 33 of the photodiode 30 of the detection element 3 is electrically coupled to the reset transistor Mrst and the source follower transistor Msf through the lower electrode 35 and the coupling wiring SLcn.

The upper electrode 34 is provided above the p-type semiconductor layer 32. The upper electrode 34 is formed of, for example, a light-transmitting conductive material such as indium tin oxide (ITO). The insulating film 27 is provided above the insulating film 26 so as to cover the photodiode 30 and the upper electrode 34. The insulating film 27 is provided with the contact hole H1 (opening) in a region overlapping the upper electrode 34.

The coupling wiring 36 is provided above the insulating film 27, and is electrically coupled to the upper electrode 34 through the contact hole H1 (opening). The p-type semiconductor layer 32 is supplied with the reference potential VCOM (refer to FIG. 4) through the coupling wiring 36 and the upper electrode 34.

The insulating film 28 is provided above the insulating film 27 so as to cover the upper electrode 34 and the coupling wiring 36. The insulating film 28 is provided as a protective layer for restraining water from entering the photodiode 30. In addition, an insulating film 29 is provided above the insulating film 28. The insulating film 29 is a hard coat film formed of an organic material. The insulating film 29 planarizes steps on a surface of the insulating film 28 formed by the photodiode 30 and the coupling wiring 36.

The cover member 122 is provided so as to face the insulating film 29. That is, the cover member 122 is provided so as to cover the various transistors and the photodiode 30. The adhesive layer 125 bonds the insulating film 29 to the cover member 122. The adhesive layer 125 is, for example, a light-transmitting optically clear adhesive (OCA) sheet.

As described above, in the present embodiment, the insulating film 26 is provided so as to cover the transistors such as the reset transistor Mrst, and the lower electrode 35, the photodiode 30, and the upper electrode 34 are stacked in this order above the insulating film 26. Since the lower electrode 35, the photodiode 30, and the upper electrode 34 are provided in layers different from those of the transistors, the signal lines, and the scan lines, the degree of freedom of arrangement of the photodiode 30 and the lower electrode 35 can be improved, as described above.

Figure 8:
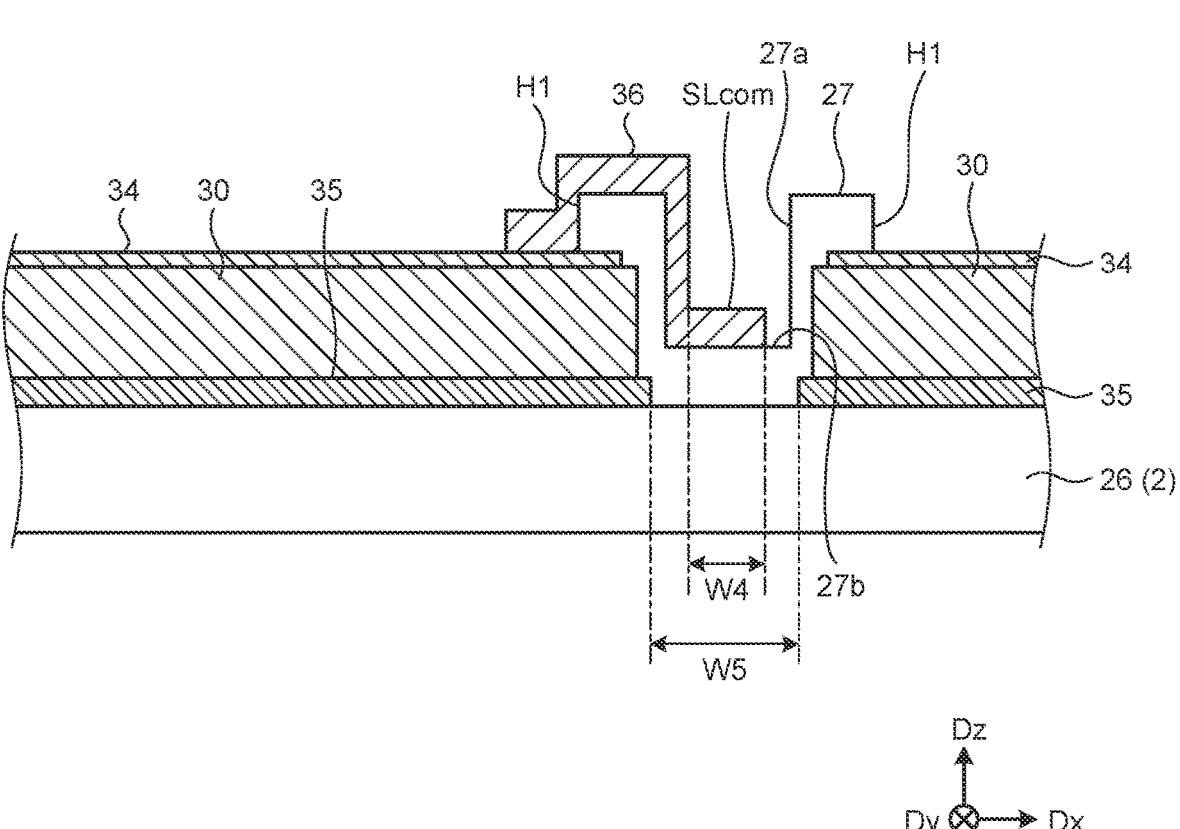
FIG. 8 is an VIII-VIII' sectional view of FIG. 6.

FIG. 8 is an VIII-VIII' sectional view of FIG. 6. FIG. 8 explains a sectional configuration between two of the photodiodes 30 adjacent in the first direction Dx. FIG. 8 does not illustrate the configuration of the array substrate 2 below the insulating film 26.

As illustrated in FIG. 8, the insulating film 27 (element insulating film) is provided between the two adjacent photodiodes 30, and has the contact hole H1 (opening) in the region overlapping the upper electrode 34. The insulating film 27 is provided so as to cover the peripheries of the upper electrode 34 and the photodiodes 30. The insulating film 27 is provided along side surfaces of the two adjacent photodiodes 30 and a surface of the insulating film 26, thereby forming a recess 27a. While FIG. 8 illustrates the recess 27a extending in the second direction Dy, the recess 27a is formed in a frame shape along the perimeter of the photodiode 30.

The reference potential supply wiring SLcom is provided above the insulating film 27 between the adjacent photodiodes 30. More specifically, the reference potential supply wiring SLcom is provided on a bottom surface 27b of the recess 27a, and extends in the second direction Dy in the recess 27a. The coupling wiring 36 is coupled to the reference potential supply wiring SLcom, and extends in the first direction Dx along a surface of the insulating film 27. An end in the first direction Dx of the coupling wiring 36 is coupled to the upper electrode 34. This configuration electrically couples the reference potential supply wiring SLcom to the upper electrode 34 through the coupling wiring 36 and the contact hole H1 (opening).

The reference potential supply wiring SLcom is provided in a position not overlapping the lower electrode 35. That is, a width W4 in the first direction Dx of the reference potential supply wiring SLcom is smaller than a width W5 between the lower electrodes 35 adjacent in the first direction Dx. This configuration ensures insulation between the anode and the cathode of the photodiode 30.

Thus, the reference potential supply wiring SLcom is provided above the insulating film 27, that is, in a layer different from that of the lower electrode 35. This configuration can improve the degree of freedom of arrangement of the lower electrode 35 and the photodiode 30, and can increase the area of the sensor region SA (lower electrode 35), as compared with a configuration in which the reference potential supply wiring SLcom is provided in the same layer as that of the lower electrode 35.

The plan views and the sectional views illustrated in FIGS. 5 to 8 are merely examples, and can be changed as appropriate. For example, as illustrated in FIGS. 5 and 6, the lower electrode 35 and the photodiode 30 are provided in the region surrounded by the output signal lines SL and the reset control scan lines GLrst, and are arranged so as not to overlap the output signal lines SL and the reset control scan lines GLrst. However, the lower electrode 35 and the photodiode 30 are not limited to this arrangement, and may be provided so as to overlap the output signal lines SL and the reset control scan lines GLrst. The photodiode 30, the upper electrode 34, and the lower electrode 35 may also be changed in planar shape as appropriate.

As described above, the detection device 1 of the present embodiment includes a substrate 21, the photodiodes 30 arranged on the substrate 21, the transistors (reset transistor Mrst, read transistor Mrd, and source follower transistor Msf) provided correspondingly to each of the photodiodes 30, the insulating film 26 covering the transistors, and the lower electrodes 35 that are each provided above the insulating film 26 correspondingly to each of the photodiodes 30 and are each electrically coupled to the transistors (reset transistor Mrst and source follower transistor Msf). The lower electrodes 35 and the photodiodes 30 are stacked in this order above the insulating film 26, and one of the lower electrodes 35 and one of the photodiodes 30 are provided so as to overlap the transistors in a plan view from a direction orthogonal to the substrate 21.

This configuration reduces restrictions by the various types of wiring and the various transistors on the array substrate 2 side, as compared with a configuration in which the photodiode 30 and the lower electrode 35 are provided in the same layer as that of the various types of wiring and the various transistors on the array substrate 2 side. That is, the degree of freedom of arrangement of the photodiode 30 and the lower electrode 35 can be improved. As illustrated in FIGS. 5 and 6, the lower electrode 35 is provided so as to overlap the transistors and to occupy most of the region surrounded by two of the reset control scan lines GLrst and two of the output signal lines SL. The sensor region SA of the detection element 3 is defined by the lower electrode 35 coupled to the photodiode 30, and the optical sensitivity of the detection device 1 can be improved by increasing the area of the sensor region SA.

Second Embodiment

Figure 9:
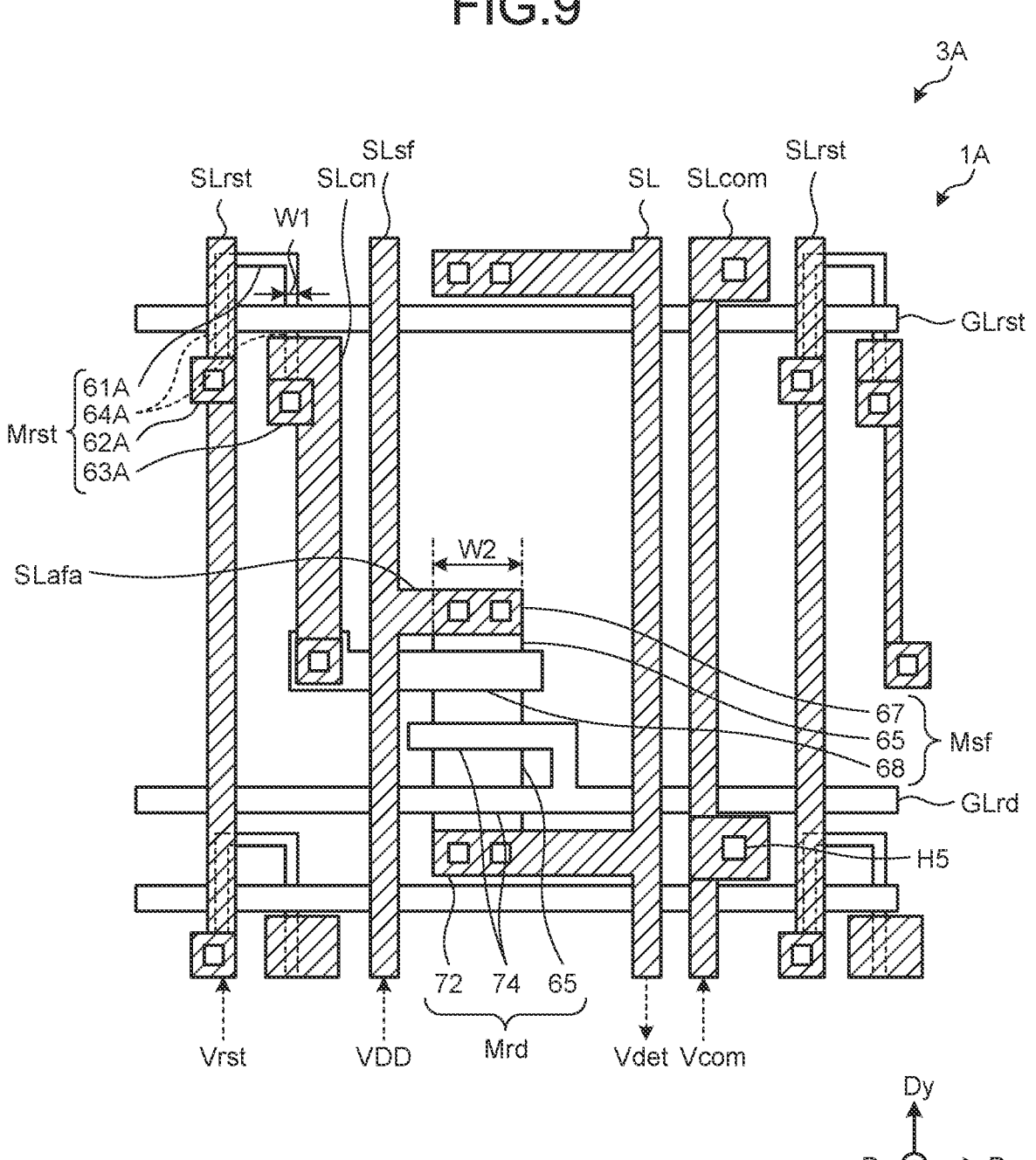
FIG. 9 is a plan view illustrating the array substrate constituting a detection element according to a second embodiment of the present disclosure.
Figure 10:
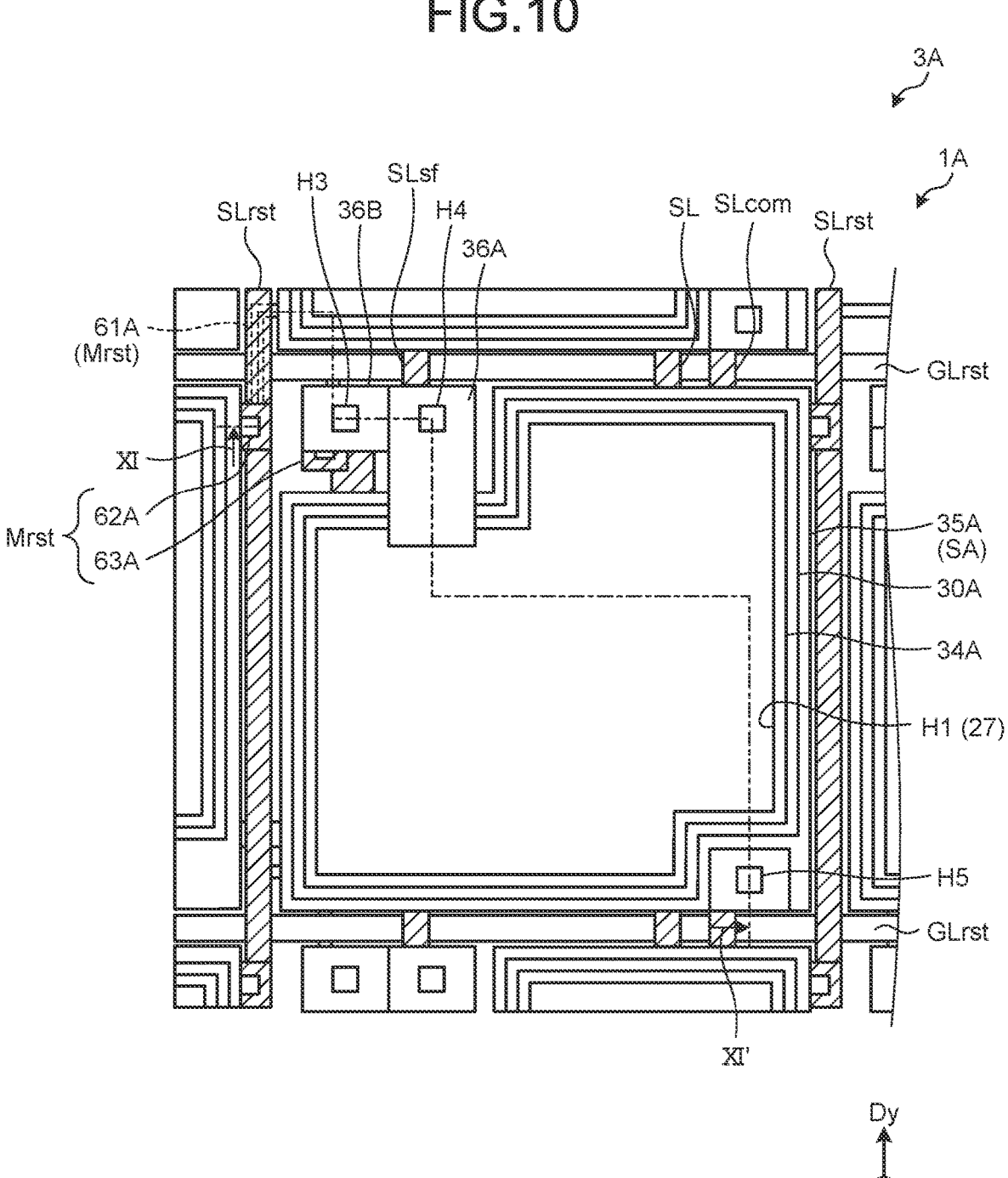
FIG. 10 is a plan view illustrating the detection element according to the second embodiment.

FIG. 9 is a plan view illustrating the array substrate constituting a detection element according to a second embodiment of the present disclosure. FIG. 10 is a plan view illustrating the detection element according to the second embodiment. In the following description, the same components as those described in the embodiment described above are denoted by the same reference numerals, and the description thereof will not be repeated.

In the second embodiment, unlike in the first embodiment described above, a configuration will be described in which a photodiode 30A is provided in a reversed order. That is, in the present embodiment, an upper electrode 34A serves as the cathode of the photodiode 30A and a lower electrode 35A serves as the anode of the photodiode 30A.

As illustrated in FIG. 9, in a detection device 1A (detection element 3A) of the second embodiment, the reset transistor Mrst is provided between the reset signal line SLrst and the power supply signal line SLsf. One end of a first semiconductor layer 61A of the reset transistor Mrst is coupled to the reset signal line SLrst. The first semiconductor layer 61A is formed in a U-shape, and two portions thereof extending in the first direction Dx each intersect the reset control scan line GLrst. The other end of the first semiconductor layer 61A is coupled to the coupling wiring SLcn. A portion of the reset signal line SLrst coupled to the first semiconductor layer 61A serves as a source electrode 62A, and a portion of the coupling wiring SLcn coupled to the first semiconductor layer 61A serves as a drain electrode 63A. Portions of the reset control scan line GLrst overlapping the first semiconductor layer 61A of the reset control scan line GLrst serve as gate electrodes 64A.

The coupling wiring SLcn extends in the second direction Dy between the reset signal line SLrst and the power supply signal line SLsf. Unlike in the first embodiment, the coupling wiring SLcn is not provided with the contact hole H2 for electrical coupling to the lower electrode 35. The gate electrode 68 coupled to the coupling wiring SLcn extends in the first direction Dx, intersects the power supply signal line SLsf, and overlaps the second semiconductor layer 65. The source follower transistor Msf and the read transistor Mrd have the same configurations as those in the first embodiment, and will not be described again.

The reference potential supply wiring SLcom is provided between the output signal line SL and the reset signal line SLrst adjacent in the first direction Dx, and extends in the second direction Dy. A portion of the reference potential supply wiring SLcom is provided with a pad projecting in the first direction Dx. A position overlapping the pad is provided with a contact hole H5 for electrical coupling to the lower electrode 35.

As illustrated in FIG. 10, the photodiode 30A is provided in a region surrounded by two of the reset control scan lines GLrst adjacent in the second direction Dy and two of the reset signal lines SLrst adjacent in the first direction Dx. The upper electrode 34A and the lower electrode 35A face each other with the photodiode 30A interposed therebetween in the third direction Dz. The photodiode 30A, the upper electrode 34A, and the lower electrode 35A have cutouts formed in positions overlapping the reset transistor Mrst, and thus, are provided so as not to overlap the reset transistor Mrst.

The lower electrode 35A is electrically coupled to the reference potential supply wiring SLcom through the contact hole H5. A cutout of the lower electrode 35A is formed, and a relay electrode 36B is provided in a region not overlapping the lower electrode 35A. The relay electrode 36B extends in the first direction Dx, and one end of the relay electrode 36B is electrically coupled to the coupling wiring SLcn through a contact hole H3. The other end of the relay electrode 36B is electrically coupled to coupling wiring 36A through a contact hole H4. The coupling wiring 36A extends in the second direction Dy, and is electrically coupled to the upper electrode 34 through the contact hole H1 provided in the insulating film 27.

Figure 11:
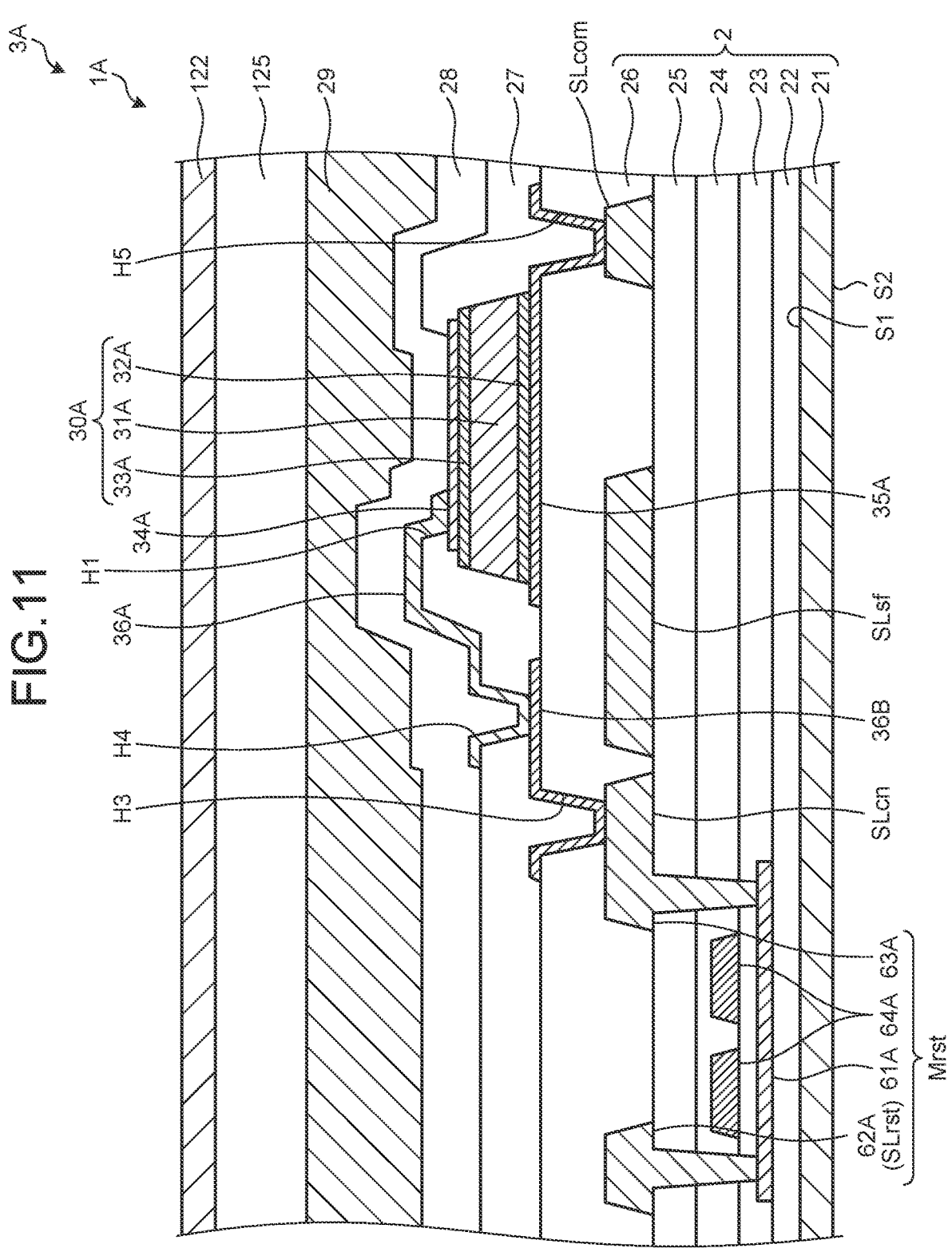
FIG. 11 is an XI-XI' sectional view of FIG. 10.

FIG. 11 is an XI-XI' sectional view of FIG. 10. As illustrated in FIG. 11, in the photodiode 30A of the present embodiment, a p-type semiconductor layer 32A, an i-type semiconductor layer 31A, and an n-type semiconductor layer 33A are stacked in this order above the lower electrode 35A.

The reference potential supply wiring SLcom is provided between the substrate 21 and the insulating film 26, more specifically, in the same layer as that of the various signal lines, such as the reset signal line SLrst and the lower supply signal line SLsf, above the insulating film 25. The lower electrode 35A is electrically coupled to the reference potential supply wiring SLcom through the contact hole H5 provided in the insulating film 26.

The relay electrode 36B is provided in the same layer as that of the lower electrode 35A above the insulating film 26. The relay electrode 36B is located adjacent to the lower electrode 35A so as to be separate therefrom. The relay electrode 36B is electrically coupled to the upper electrode 34A through the contact hole H4 provided in the insulating film 27 (element insulating film) and the coupling wiring 36A. The relay electrode 36B is also electrically coupled to the reset transistor Mrst through the contact hole H3 provided in the insulating film 26 and the coupling wiring SLcn.

As described above, in the photodiode 30A, the p-type semiconductor layer 32A, the i-type semiconductor layer 31A, and the n-type semiconductor layer 33A are stacked in this order above the lower electrode 35A. Also with this configuration, the p-type semiconductor layer 32A (lower electrode 35A) is electrically coupled to the reference potential supply wiring SLcom provided on the array substrate 2 through the contact hole H5, and the n-type semiconductor layer 33A (upper electrode 34A) is coupled to the reset transistor Mrst through the coupling wiring 36A and the relay electrode 36B.

The photodiode 30A and the lower electrode 35A are provided so as to overlap the read transistor Mrd and the source follower transistor Msf in the plan view. The photodiode 30A and the lower electrode 35A are provided so as to overlap also some of the signal lines and the scan lines (power supply signal line SLsf, reset signal line SLrst, reference potential supply wiring SLcom, and read control scan line GLrd).

The first semiconductor layer 61A of the reset transistor Mrst is formed in a U-shape, and thus, the distance in the first direction Dx between the source and the drain is smaller than that in the first embodiment. This configuration can reduce the area occupied by the reset transistor Mrst in the detection element 3A. As a result, a larger area of the sensor region SA can also be ensured with the configuration in which the p-type semiconductor layer 32A, the i-type semiconductor layer 31A, and the n-type semiconductor layer 33A are stacked in this order.

Third Embodiment

Figure 12:
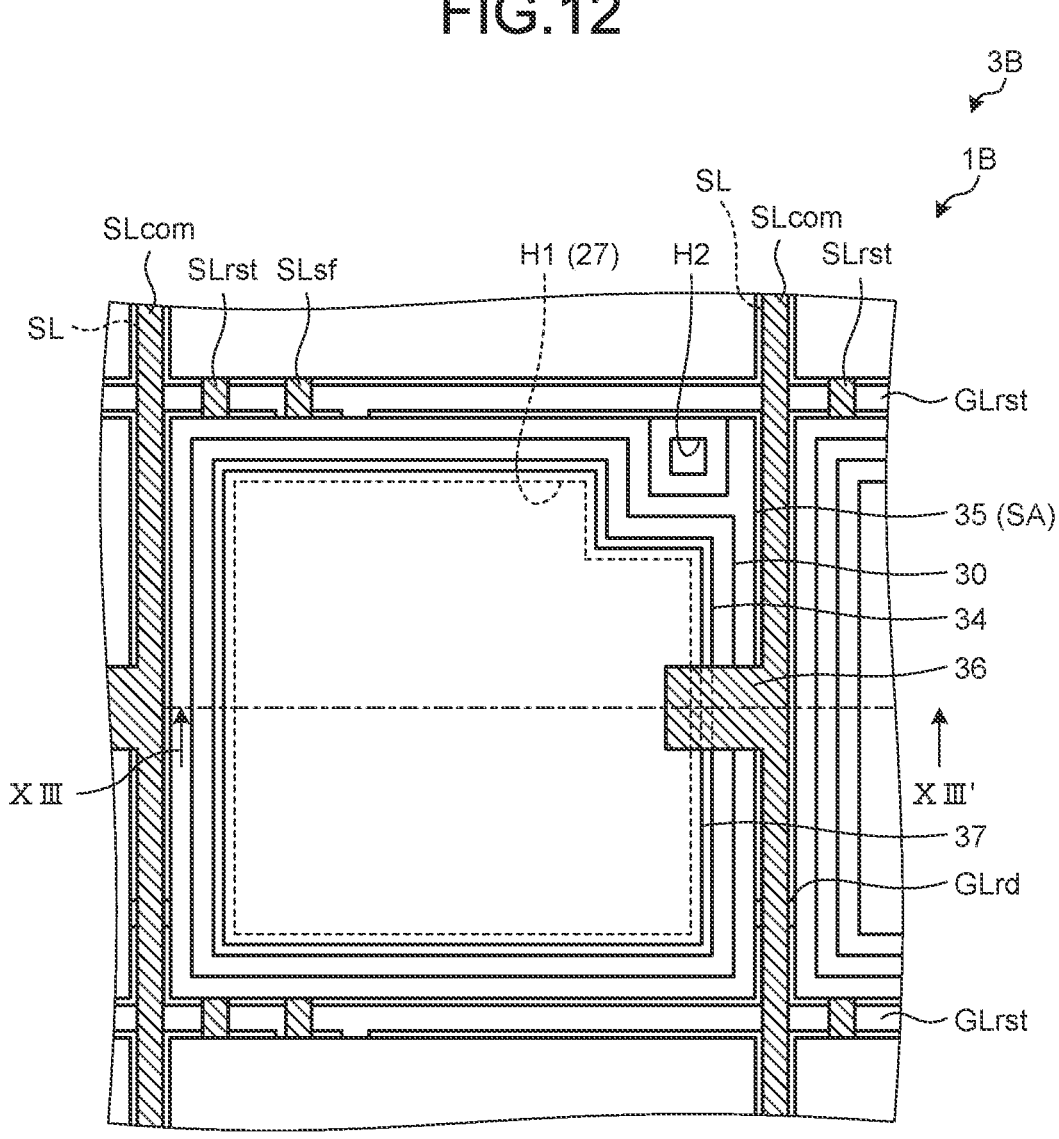
FIG. 12 is a plan view illustrating a detection device according to a third embodiment of the present disclosure.
Figure 12:
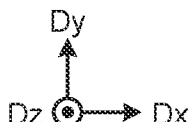
Figure 13:
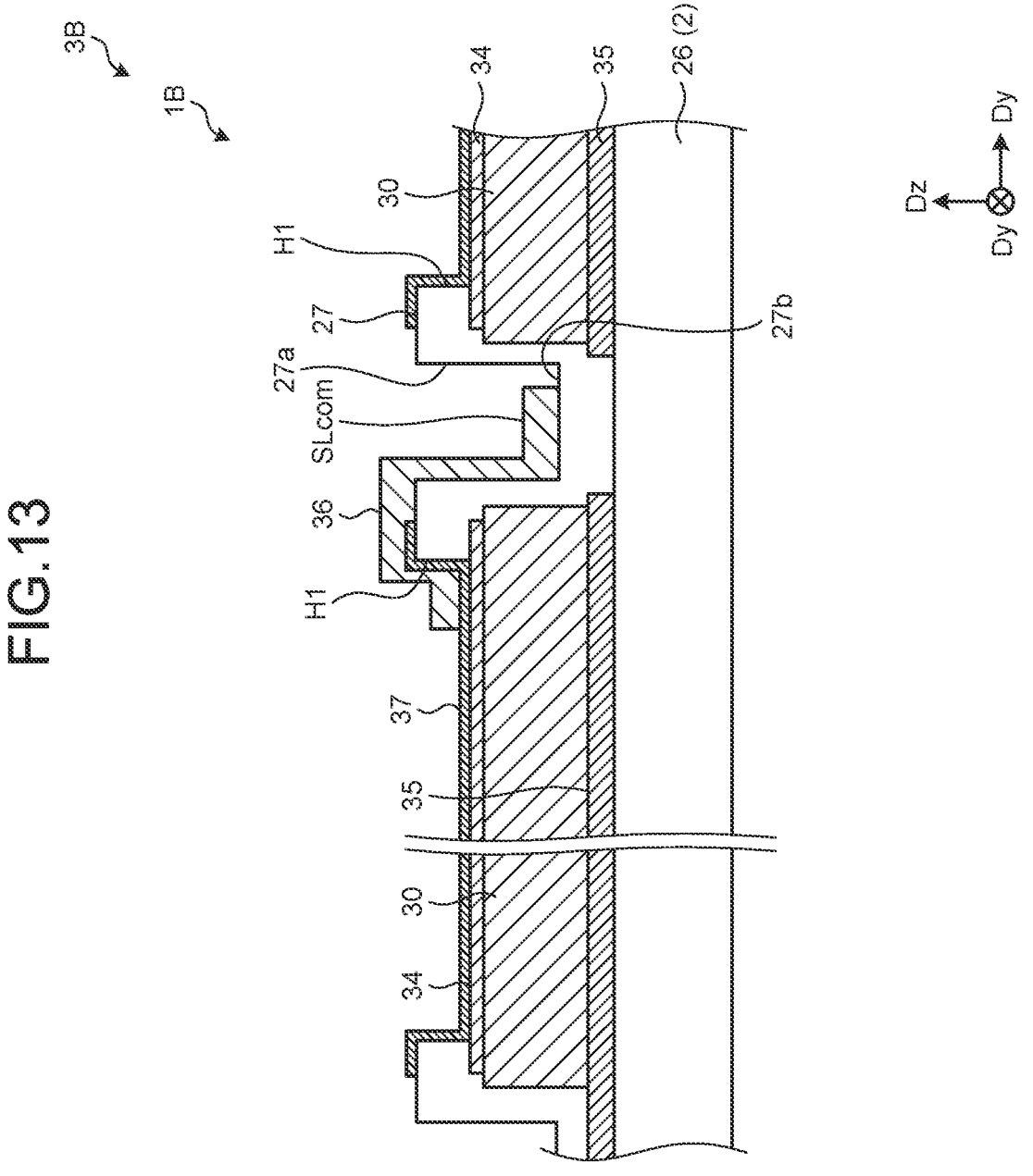
FIG. 13 is a XIII-XIII' sectional view of FIG. 12.

FIG. 12 is a plan view illustrating a detection device according to a third embodiment of the present disclosure. FIG. 13 is a XIII-XIII' sectional view of FIG. 12. As illustrated in FIGS. 12 and 13, in a detection device 1B (detection element 3B) of the third embodiment, the upper electrode 34 and an overlapping electrode 37 are stacked above the photodiode 30.

As illustrated in FIGS. 12 and 13, the insulating film 27 (element insulating film) has the contact hole H1 (opening) in the region overlapping the upper electrode 34, and is provided so as to cover the peripheries of the photodiode 30 and the upper electrode 34.

The overlapping electrode 37 is provided so as to cover the contact hole H1 of the insulating film 27, and is coupled to the upper electrode 34 in a region overlapping the contact hole H1. The overlapping electrode 37 is provided along the inner wall of the contact hole H1 and the upper surface of the insulating film 27, and covers the boundary portion between the upper electrode 34 and the insulating film 27. The coupling wiring 36 is coupled to the overlapping electrode 37 in the region overlapping the contact hole H1. The above-described configuration electrically couples the photodiode 30 to the reference potential supply wiring SLcom through the upper electrode 34, the overlapping electrode 37, and the coupling wiring 36.

As illustrated in FIG. 12, the overlapping electrode 37 is provided so as to cover the entire region of the contact hole H1. In other words, the inner wall of contact hole H1 is located inside the outer perimeter of the overlapping electrode 37. As illustrated in FIG. 13, the position of an end of the overlapping electrode 37 overlaps the position of an end of the upper electrode 34. However, the end of the overlapping electrode 37 may be deviated from the end of the upper electrode 34.

In the present embodiment, the overlapping electrode 37 serves as a protective film for the photodiode 30, and can restrain water or the like from entering the photodiode 30 side. When layers (for example, the coupling wiring 36 and the reference potential supply wiring SLcom) above the photodiode 30 are patterned in the manufacturing process of the detection device 1B, the overlapping electrode 37 serves as the protective film to restrain the photodiode 30 from being damaged. For example, since the overlapping electrode 37 is provided so as to cover the interface between the upper electrode 34 and the insulating film 27, the etchant can be restrained from entering the photodiode 30 side through the interface.

In FIGS. 12 and 13, the configuration of, for example, the photodiode 30 and the various transistors is the same as that in the first embodiment. However, the present embodiment can also be applied to the detection device 1A of the second embodiment.

Fourth Embodiment

Figure 14:
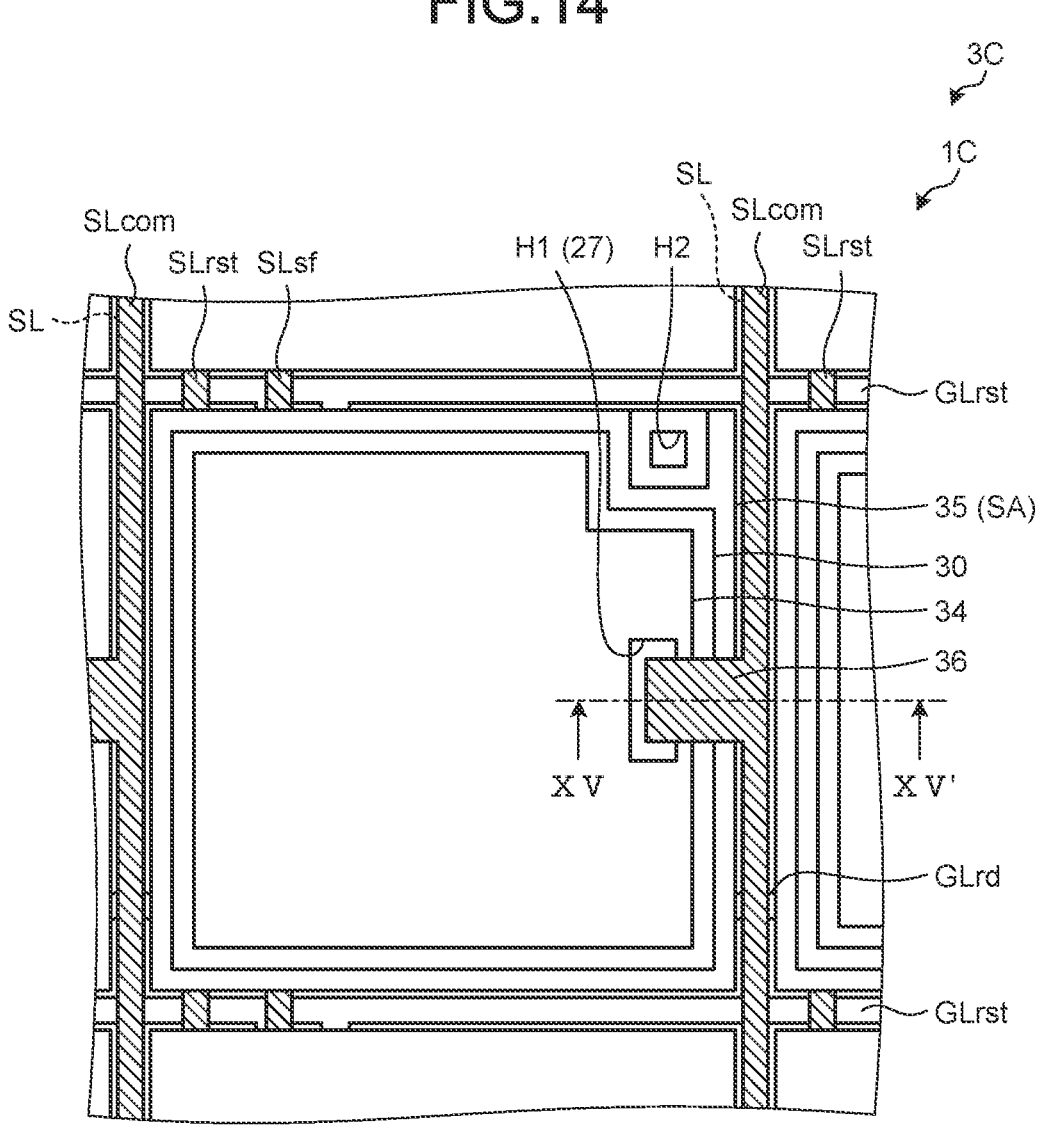
FIG. 14 is a plan view illustrating a detection device according to a fourth embodiment of the present disclosure.
Figure 14:
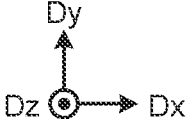
Figure 15:
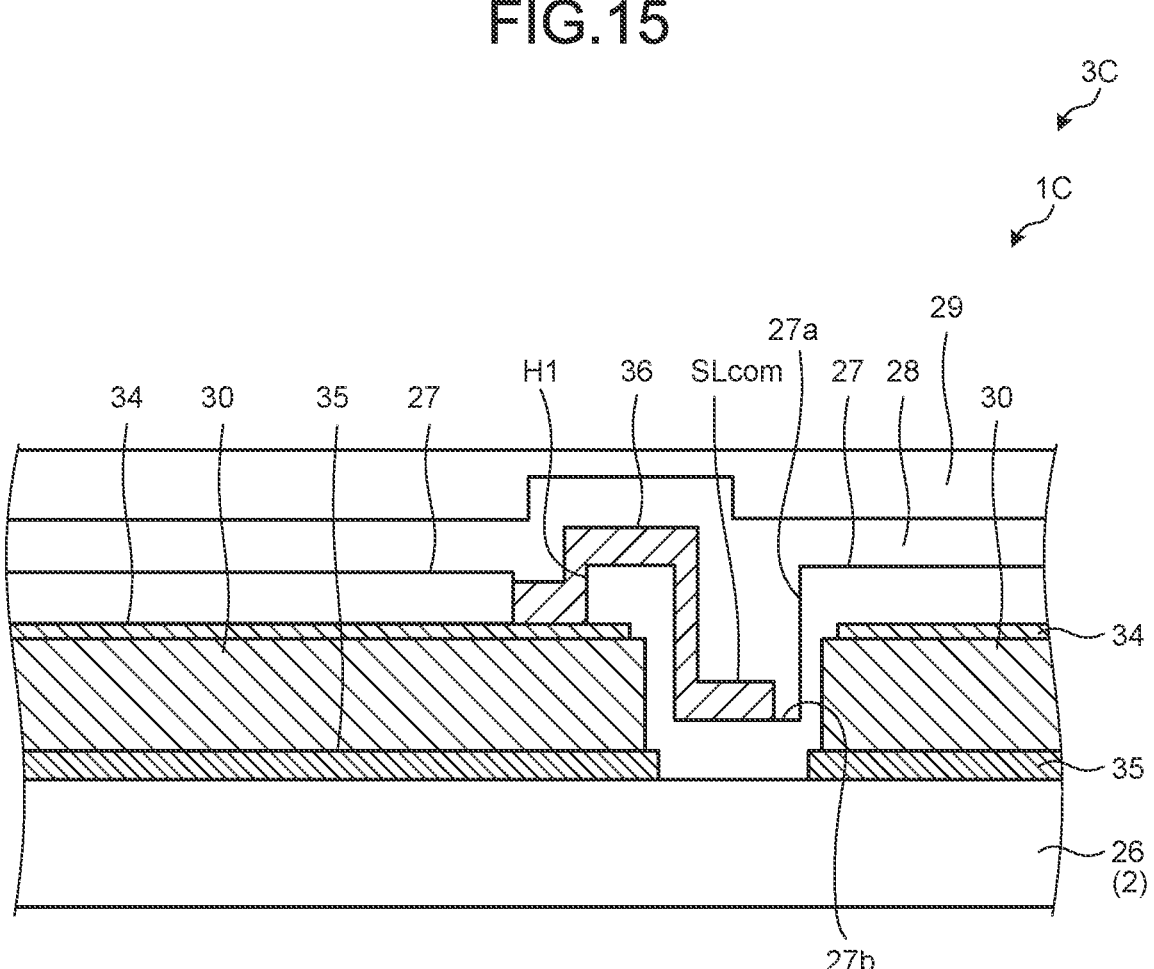
FIG. 15 is a XV-XV' sectional view of FIG. 14.
Figure 15:
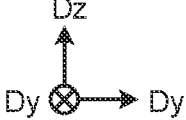

FIG. 14 is a plan view illustrating a detection device according to a fourth embodiment of the present disclosure. FIG. 15 is a XV-XV' sectional view of FIG. 14. As illustrated in FIGS. 14 and 15, in a detection device 1C (detection element 3C) of the fourth embodiment, the area of the contact hole H1 (opening) provided in the insulating film 27 is smaller than those in the embodiments described above. The contact hole H1 is provided at a coupling portion between the reference potential supply wiring SLcom and the upper electrode 34. More specifically, the contact hole H1 is provided in a portion where the coupling wiring 36 contacts the upper electrode 34.

The insulating film 27 (element insulating film) is provided above the upper electrode 34 so as to cover around a portion where the upper electrode 34 is coupled to the coupling wiring 36, and covers most of the region of the upper electrode 34. The insulating film 28 (overlapping insulating film) is provided so as to cover the insulating film 27, the coupling wiring 36, and the contact hole H1. The insulating film 28 is provided so as to cover the entire sensor region SA.

In the present embodiment, the area of the contact hole H1 is smaller, and the insulating film 27 is formed so as to cover most of the region of the upper electrode 34. As a result, the insulating film 27 serves as a protective film for the photodiode 30 and the upper electrode 34. In addition, when the insulating film 27 is patterned by, for example, dry etching in the manufacturing process of the detection device 1C, the upper electrode 34 can be retrained from being damaged.

In FIG. 15, a side surface of the coupling wiring 36 is in contact with the insulating film 27 in the contact hole H1. However, the present embodiment is not limited to this configuration, and a gap may be formed between the side surface of the coupling wiring 36 and the insulating film 27. The configuration of, for example, the photodiode 30 and the various transistors illustrated in FIGS. 14 and 15 is the same as that in the first embodiment. However, the present embodiment can also be applied to the detection devices 1A and 1B of the second and the third embodiments.

Fifth Embodiment

Figure 16:
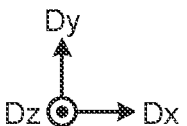
FIG. 16 is a plan view illustrating the array substrate constituting a detection element according to a fifth embodiment of the present disclosure.

FIG. 16 is a plan view illustrating the array substrate constituting a detection element according to a fifth embodiment of the present disclosure. As illustrated in FIG. 16, in a detection device 1D (detection element 3D) of the fifth embodiment, a first electrode 81 and a second electrode 82 are provided in regions overlapping the photodiode 30. The first and the second electrodes 81 and 82 are provided so as to overlap each other in the plan view. The first and the second electrodes 81 and 82 are provided in regions overlapping none of the reset transistor Mrst, the source follower transistor Msf, and the read transistor Mrd.

The first electrode 81 is provided for each of the detection elements 3D, and the first electrodes 81 adjacent in the first direction Dx are provided so as to be separate from each other. In the plan view, the output signal line SL is provided between the first electrodes 81 adjacent in the first direction Dx. The second electrode 82 is provided continuously across the detection elements 3D adjacent in the first direction Dx.

In the present embodiment, the first and the second electrodes 81 and 82 are provided between the substrate 21 and the photodiode 30 in the third direction Dz. The second electrode 82 faces the first electrode 81 with one or a plurality of layers of insulating films among the insulating films of the array substrate 2 interposed between the first and the second electrodes 81 and 82. Specifically, the first and the second electrodes 81 and 82 are provided using two of the layers constituting a transistor (for example, the reset transistor Mrst). The first electrode 81 is in the same layer as that of the gate electrode 64, for example, and is formed of the same material as that of the gate electrode 64. The second electrode 82 is in the same layer as the first semiconductor layer 61, for example, and is formed of the same material as that of the first semiconductor layer 61.

A capacitor is formed between the first and the second electrodes 81 and 82 facing each other with the insulating film or films interposed therebetween. The capacitor formed between the first and the second electrodes 81 and 82 is coupled to the node N1 in parallel with the capacitive element Cs (refer to FIG. 4). In the present embodiment, the capacitance of the capacitor formed between the first and the second electrodes 81 and 82 is added to the capacitance of the capacitive element Cs. Therefore, the potential of the node N1 can be restrained from dropping during an exposure period between a reset period (period when the potential of the node N1 is reset to the reset potential Vrst) and a read period (period when the read transistor Mrd is turned on). As a result, the potential of the node N1 is restrained from fluctuating, and, consequently, the signal (voltage) output from the source follower transistor Msf is restrained from fluctuating.

Any of the layers of the array substrate 2 may be used to form the first and the second electrodes 81 and 82. The shapes in the plan view of the first and the second electrodes 81 and 82 can also be changed as appropriate. For example, in FIG. 16, the first and the second electrodes 81 and 82 may also be provided in a region SP between the output signal line SL and the right side of the source follower transistor Msf and the read transistor Mrd. This configuration can increase the capacitance added to the capacitive element Cs. In FIG. 16, the area of the second electrode 82 is larger than the area of the first electrode 81 in one sensor region SA. The present embodiment is not limited thereto. The area of the first electrode 81 may be larger than or the same as the area of the second electrode 82.

In FIG. 16, the configuration of, for example, the photodiode 30 and the various transistors is the same as that in the first embodiment. However, the present embodiment can also be applied to the detection devices 1A, 1B, and 1C of the second and the third embodiments.

While the preferred embodiments of the present disclosure have been described above, the present disclosure is not limited to the embodiments described above. The content disclosed in the embodiments is merely an example, and can be variously modified within the scope not departing from the gist of the present disclosure. Any modifications appropriately made within the scope not departing from the gist of the present disclosure also naturally belong to the technical scope of the present disclosure.

What is claimed is:

1. A detection device comprising:

a substrate;

a plurality of photodiodes arranged on the substrate;

a plurality of transistors provided correspondingly to each of the photodiodes;

an insulating film that covers the transistors; and a plurality of lower electrodes each of which is provided above the insulating film correspondingly to each of the photodiodes, and is electrically coupled to the transistors, wherein the lower electrodes and the photodiodes are stacked in this order above the insulating film, one of the lower electrodes and one of the photodiodes are provided so as to overlap the transistors in a plan view from a direction orthogonal to the substrate, the transistors comprise:

a reset transistor that comprises a first semiconductor layer, and is configured to supply a reset potential to the photodiode; and a read transistor that comprises a second semiconductor layer, and is configured to output a signal generated by the photodiode to an output signal line, the first semiconductor layer of the reset transistor and the second semiconductor layer of the read transistor are disposed in each area surrounded by two of the output signal lines adjacent to each other in a first direction and two of reset control scan lines adjacent to each other in a second direction crossing the first direction, the first semiconductor layer of the reset transistor extends in the first direction crossing the output signal lines, the second semiconductor layer of the read transistor extends in the second direction crossing the first direction, and a width in the second direction intersecting an extending direction of the first semiconductor layer of the reset transistor is smaller than a width in the first direction intersecting an extending direction of the second semiconductor layer of the read transistor.

2. The detection device according to claim 1, wherein the reset transistor has a double-gate structure.

3. The detection device according to claim 1, wherein the transistors further comprise a source follower transistor, the read transistor and the source follower transistor comprise the common second semiconductor layer, the second semiconductor layer is provided adjacent to the output signal line in the first direction, and the second semiconductor layer and the output signal line extend in the second direction.

4. The detection device according to claim 3, wherein the read transistor has a double-gate structure, the source follower transistor has a single-gate structure, and two gate electrodes included in the read transistor and one gate electrode included in the source follower transistor are arranged in the second direction so as to overlap the second semiconductor layer.

5. The detection device according to claim 1, comprising:

an upper electrode provided above the photodiode;

an element insulating film that is provided between the adjacent photodiodes, and has an opening in a region overlapping the upper electrode; and reference potential supply wiring configured to supply a reference potential to the photodiode, wherein the reference potential supply wiring is provided above the element insulating film between the adjacent photodiodes, and is electrically coupled to the upper electrode through the opening.

6. The detection device according to claim 5, wherein the opening is provided at a coupling portion between the reference potential supply wiring and the upper electrode, the element insulating film is provided above the upper electrode so as to cover around a portion where the upper electrode is coupled to the reference potential supply wiring, and the detection device further comprises an overlapping insulating film that covers the element insulating film and the opening.

7. The detection device according to claim 1, wherein the photodiode comprises an i-type semiconductor layer, a p-type semiconductor layer, and an n-type semiconductor layer, and the n-type semiconductor layer, the i-type semiconductor layer, and the p-type semiconductor layer are stacked in this order above the lower electrode.

8. The detection device according to claim 1, comprising reference potential supply wiring that is provided between the substrate and the insulating film, and is configured to supply a reference potential to the photodiode, wherein the photodiode comprises an i-type semiconductor layer, a p-type semiconductor layer, and an n-type semiconductor layer, the p-type semiconductor layer, the i-type semiconductor layer, and the n-type semiconductor layer are stacked in this order above the lower electrode, and the lower electrode is electrically coupled to the reference potential supply wiring through a contact hole provided in the insulating film.

9. The detection device according to claim 8, comprising:

an upper electrode provided above the photodiode;

an element insulating film that is provided between the adjacent photodiodes, and has an opening in a region overlapping the upper electrode; and a relay electrode that is provided above the insulating film, and is located adjacent to the lower electrode so as to be separate from the lower electrode, wherein the relay electrode is electrically coupled to the upper electrode through a contact hole provided in the element insulating film, and is also electrically coupled to the transistors through a contact hole provided in the insulating film.

10. The detection device according to claim 1, comprising:

an upper electrode provided above the photodiode;

an element insulating film that is provided between the adjacent photodiodes, has an opening in a region overlapping the upper electrode, and covers peripheries of the upper electrode; and an overlapping electrode provided so as to cover the opening of the element insulating film and overlap the upper electrode.

* * * * *